(12) United States Patent
Wu et al.

(10) Patent No.: US 11,791,385 B2
(45) Date of Patent: *Oct. 17, 2023

(54) WIDE BANDGAP TRANSISTORS WITH GATE-SOURCE FIELD PLATES

(75) Inventors: Yifeng Wu, Goleta, CA (US); Primit Parikh, Goleta, CA (US); Umesh Mishra, Montecito, CA (US); Scott Sheppard, Chapel Hill, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/078,265

(22) Filed: Mar. 11, 2005

(65) Prior Publication Data

US 2006/0202272 A1   Sep. 14, 2006

(51) Int. Cl.
*H01L 29/40* (2006.01)
*H01L 29/778* (2006.01)
*H01L 29/20* (2006.01)

(52) U.S. Cl.
CPC .......... *H01L 29/402* (2013.01); *H01L 29/404* (2013.01); *H01L 29/7787* (2013.01); *H01L 29/2003* (2013.01)

(58) Field of Classification Search
CPC . H01L 29/402; H01L 29/404; H01L 29/7787; H01L 29/2003
USPC .......................... 257/488, 496, 508, E29.009
See application file for complete search history.

(56) References Cited

U.S. PATENT DOCUMENTS

| | | | |
|---|---|---|---|
| 4,290,077 A | 9/1981 | Ronen | 257/409 |
| 4,551,905 A | 11/1985 | Chao et al. | 438/570 |
| 4,766,474 A | 8/1988 | Nakagawa et al. | |
| 4,947,232 A | 8/1990 | Ashida et al. | |
| 5,053,348 A | 10/1991 | Mishra et al. | 438/571 |
| 5,187,552 A * | 2/1993 | Hendrickson et al. | 257/408 |
| 5,192,987 A | 3/1993 | Khan et al. | 257/183.1 |
| 5,196,359 A | 3/1993 | Shih et al. | |
| 5,290,393 A | 3/1994 | Nakamura | 257/488 |

(Continued)

FOREIGN PATENT DOCUMENTS

| | | |
|---|---|---|
| CN | 1242608 A | 1/2000 |
| CN | 1321340 | 11/2001 |

(Continued)

OTHER PUBLICATIONS

Saito et al. "High Breakdown Voltage AlGaN—GaN Power-HEMT Design and High Current Density Switching Behavior." IEEE Transactions on Elecron Devices. vol. 50, No. 12, Dec. 2003. pp. 2528-2531.*

(Continued)

*Primary Examiner* — Ori Nadav
(74) *Attorney, Agent, or Firm* — Myers Bigel, P.A.

(57) ABSTRACT

A transistor comprising an active region having a channel layer, with source and drain electrodes formed in contact with the active region and a gate formed between the source and drain electrodes and in contact with the active region. A spacer layer is on at least part of the surface of the plurality of active region between the gate and the drain electrode and between the gate and the source electrode. A field plate is on the spacer layer and extends on the spacer and over the active region toward the drain electrode. The field plate also extends on the spacer layer over the active region and toward the source electrode. At least one conductive path electrically connects the field plate to the source electrode or the gate.

29 Claims, 4 Drawing Sheets

(56) References Cited

U.S. PATENT DOCUMENTS

| | | | | |
|---|---|---|---|---|
| 5,381,031 A * | 1/1995 | Shibib | H01L 23/60 | |
| | | | 257/337 | |
| 5,399,886 A | 3/1995 | Hasegawa | 257/192 | |
| 5,470,767 A | 11/1995 | Nakamoto et al. | 438/570 | |
| 5,543,253 A * | 8/1996 | Park | G03F 1/144 | |
| | | | 216/12 | |
| 5,569,937 A | 10/1996 | Bhatnagar | 257/77 | |
| 5,643,811 A | 7/1997 | Hasegawa | 257/E21.407 | |
| 5,652,179 A | 7/1997 | Strifler et al. | 438/578 | |
| 5,701,019 A | 12/1997 | Matsumoto et al. | 257/192 | |
| 5,710,455 A | 1/1998 | Bhatnagar et al. | 257/472 | |
| 5,780,900 A * | 7/1998 | Suzuki et al. | 257/335 | |
| 5,876,901 A * | 3/1999 | Ishimaru | H01L 21/0275 | |
| | | | 257/E21.028 | |
| 5,885,860 A | 3/1999 | Weitzel et al. | 257/347 | |
| 5,929,467 A | 7/1999 | Kawai et al. | 257/192 | |
| 5,959,307 A | 9/1999 | Nakamura et al. | 257/14 | |
| 6,033,948 A | 3/2000 | Kwon | | |
| 6,038,003 A * | 3/2000 | Kim | G02F 1/1345 | |
| | | | 349/43 | |
| 6,057,564 A | 5/2000 | Rennie | 257/99 | |
| 6,100,549 A | 8/2000 | Weitzel et al. | 257/194 | |
| 6,100,571 A * | 8/2000 | Mizuta et al. | 257/488 | |
| 6,127,703 A | 10/2000 | Letavic et al. | 257/347 | |
| 6,139,995 A * | 10/2000 | Burm | G03F 9/708 | |
| | | | 257/E21.027 | |
| 6,140,169 A | 10/2000 | Kawai et al. | 438/197 | |
| 6,242,766 B1 | 6/2001 | Tateno | 257/194 | |
| 6,294,801 B1 * | 9/2001 | Inokuchi | H01L 29/42316 | |
| | | | 257/192 | |
| 6,307,232 B1 | 10/2001 | Akiyama et al. | | |
| 6,330,042 B1 * | 12/2001 | Kang | G02F 1/13458 | |
| | | | 349/43 | |
| 6,346,451 B1 | 2/2002 | Simpson et al. | 21/331 | |
| 6,355,951 B1 | 3/2002 | Hattori | 257/280 | |
| 6,404,015 B2 * | 6/2002 | Emmerik | H01L 29/1037 | |
| | | | 257/348 | |
| 6,445,038 B1 * | 9/2002 | Tihanyi | H01L 29/0619 | |
| | | | 257/339 | |
| 6,468,878 B1 | 10/2002 | Petruzzello et al. | 438/454 | |
| 6,475,857 B1 | 11/2002 | Kim | 438/240 | |
| 6,483,135 B1 | 11/2002 | Mizuta et al. | | |
| 6,495,409 B1 | 12/2002 | Manfra et al. | 438/216 | |
| 6,548,333 B2 * | 4/2003 | Smith | H01L 29/7783 | |
| | | | 257/194 | |
| 6,559,513 B1 | 5/2003 | Miller et al. | 257/488 | |
| 6,586,781 B2 | 7/2003 | Wu et al. | 257/194 | |
| 6,586,813 B2 | 7/2003 | Nagahara | | |
| 6,620,688 B2 | 9/2003 | Woo et al. | 438/262 | |
| 6,621,121 B2 | 9/2003 | Baliga | 257/330 | |
| 6,624,488 B1 | 9/2003 | Kim | 29/76 | |
| 6,627,473 B1 | 9/2003 | Oikawa et al. | 438/46 | |
| 6,664,593 B2 * | 12/2003 | Peake | H01L 29/402 | |
| | | | 257/335 | |
| 6,677,642 B2 * | 1/2004 | Peake | H01L 29/402 | |
| | | | 257/335 | |
| 6,686,616 B1 | 2/2004 | Allen et al. | 257/280 | |
| 6,690,042 B2 | 2/2004 | Khan et al. | 257/194 | |
| 6,707,102 B2 | 3/2004 | Morikawa | 257/328 | |
| 6,740,535 B2 | 5/2004 | Singh et al. | 438/18 | |
| 6,838,325 B2 | 1/2005 | Whelan et al. | 438/172 | |
| 6,870,219 B2 | 3/2005 | Brech | | |
| 6,891,235 B1 | 5/2005 | Furukawa et al. | 257/480 | |
| 6,902,964 B2 | 6/2005 | Sriram | | |
| 6,903,383 B2 * | 6/2005 | Yokogawa | H01L 21/8252 | |
| | | | 257/192 | |
| 6,914,643 B1 * | 7/2005 | Nagase | G02F 1/136204 | |
| | | | 349/40 | |
| 6,933,544 B2 | 8/2005 | Saito et al. | 257/194 | |
| 6,940,090 B2 | 9/2005 | Saito et al. | 257/20 | |
| 6,972,440 B2 | 12/2005 | Singh et al. | 257/194 | |
| 7,012,286 B2 | 3/2006 | Inai et al. | 257/192 | |
| 7,038,252 B2 | 5/2006 | Saito et al. | 257/192 | |
| 7,041,541 B2 | 5/2006 | Behammer | 438/182 | |
| 7,071,498 B2 * | 7/2006 | Johnson | H01L 21/28587 | |
| | | | 257/109 | |
| 7,075,125 B2 * | 7/2006 | Saito et al. | 257/194 | |
| 7,126,426 B2 | 10/2006 | Mishra et al. | 330/307 | |
| 7,229,903 B2 | 6/2007 | Li et al. | 438/571 | |
| 7,282,423 B2 | 10/2007 | Furukawa et al. | 438/422 | |
| 7,465,967 B2 | 12/2008 | Smith et al. | 257/194 | |
| 7,501,669 B2 | 3/2009 | Parikh et al. | 257/194 | |
| 7,508,015 B2 | 3/2009 | Saito et al. | 257/192 | |
| 7,550,783 B2 | 6/2009 | Wu et al. | 257/194 | |
| 7,679,111 B2 | 3/2010 | Cao et al. | 257/287 | |
| 7,800,131 B2 | 9/2010 | Miyamoto et al. | 257/192 | |
| 7,812,369 B2 | 10/2010 | Chini et al. | 257/192 | |
| 7,863,648 B2 | 1/2011 | Miyamoto et al. | 257/192 | |
| 7,964,915 B2 | 6/2011 | Tanaka et al. | 257/341 | |
| 8,120,066 B2 | 2/2012 | Lanzieri et al. | 257/194 | |
| 8,193,562 B2 | 6/2012 | Suh et al. | 257/194 | |
| 8,502,323 B2 | 8/2013 | Chen | 257/392 | |
| 8,823,057 B2 | 9/2014 | Sheppard et al. | 257/192 | |
| 8,901,604 B2 | 12/2014 | Mishra et al. | 257/170 | |
| 2001/0015446 A1 | 8/2001 | Inoue et al. | | |
| 2001/0023964 A1 | 9/2001 | Wu et al. | 257/368 | |
| 2002/0005528 A1 | 1/2002 | Nagahara | | |
| 2002/0017648 A1 | 2/2002 | Kasahara | | |
| 2002/0033508 A1 * | 3/2002 | Morikawa | H01L 29/402 | |
| | | | 257/368 | |
| 2002/0105028 A1 | 8/2002 | Tatsuhiko | 257/339 | |
| 2002/0137236 A1 | 9/2002 | Schaff et al. | | |
| 2002/0137318 A1 | 9/2002 | Peake et al. | | |
| 2002/0139995 A1 | 10/2002 | Inoue et al. | 257/194 | |
| 2002/0145172 A1 * | 10/2002 | Fujishima | H01L 29/41725 | |
| | | | 257/487 | |
| 2002/0155646 A1 * | 10/2002 | Petruzzello | H01L 29/402 | |
| | | | 438/149 | |
| 2003/0006437 A1 | 1/2003 | Masashi et al. | | |
| 2003/0075719 A1 | 4/2003 | Sriram | | |
| 2003/0107081 A1 | 6/2003 | Lee et al. | | |
| 2003/0132463 A1 | 7/2003 | Miyoshi | | |
| 2003/0141518 A1 * | 7/2003 | Yokogawa | H01L 21/8252 | |
| | | | 257/194 | |
| 2003/0183844 A1 | 10/2003 | Mitsunori et al. | | |
| 2003/0183886 A1 | 10/2003 | Inoue et al. | | |
| 2003/0222327 A1 | 12/2003 | Yamaguchi et al. | | |
| 2004/0021152 A1 | 2/2004 | Nguyen et al. | 257/192 | |
| 2004/0021175 A1 | 2/2004 | Brech | | |
| 2004/0021182 A1 | 2/2004 | Green et al. | | |
| 2004/0029330 A1 | 2/2004 | Hussain et al. | 438/172 | |
| 2004/0124435 A1 | 7/2004 | D'Evelyn et al. | 257/103 | |
| 2004/0188775 A1 | 9/2004 | Peake et al. | 257/397 | |
| 2004/0201038 A1 | 10/2004 | Kimura et al. | | |
| 2004/0201078 A1 * | 10/2004 | Ren | H01L 23/585 | |
| | | | 257/500 | |
| 2004/0227211 A1 | 11/2004 | Saito et al. | | |
| 2004/0251498 A1 * | 12/2004 | Zingg | H01L 29/402 | |
| | | | 257/343 | |
| 2005/0051796 A1 * | 3/2005 | Parikh et al. | 257/192 | |
| 2005/0051800 A1 | 3/2005 | Mishra | 257/202 | |
| 2005/0062069 A1 | 3/2005 | Saito et al. | 257/213 | |
| 2005/0082611 A1 | 4/2005 | Peake et al. | 257/341 | |
| 2005/0098846 A1 * | 5/2005 | Nagaoka | H01L 29/1095 | |
| | | | 257/487 | |
| 2005/0110042 A1 | 5/2005 | Saito et al. | | |
| 2005/0124100 A1 | 6/2005 | Robinson | 438/167 | |
| 2005/0133818 A1 | 6/2005 | Johnson et al. | 257/192 | |
| 2005/0208722 A1 | 9/2005 | Peake et al. | 438/259 | |
| 2005/0253167 A1 | 11/2005 | Wu et al. | | |
| 2005/0253168 A1 | 11/2005 | Wu | | |
| 2006/0006415 A1 | 1/2006 | Wu | | |
| 2006/0011915 A1 * | 1/2006 | Saito et al. | 257/65 | |
| 2006/0043416 A1 | 3/2006 | P. Li et al. | 257/192 | |
| 2006/0071247 A1 | 4/2006 | Chen et al. | 257/272 | |
| 2006/0081877 A1 | 4/2006 | Kohji et al. | 257/194 | |
| 2006/0108606 A1 | 5/2006 | Saxler | 257/200 | |
| 2006/0118809 A1 | 6/2006 | Parikh et al. | 257/103 | |
| 2006/0202272 A1 | 9/2006 | Wu | | |
| 2006/0220272 A1 | 10/2006 | Smith et al. | 257/355 | |
| 2006/0286732 A1 | 12/2006 | Burke et al. | 438/197 | |
| 2007/0059873 A1 | 3/2007 | Chini et al. | 438/199 | |

(56) References Cited

U.S. PATENT DOCUMENTS

| | | | |
|---|---|---|---|
| 2007/0102727 A1 | 5/2007 | Twynam | 257/194 |
| 2007/0164315 A1 | 7/2007 | Smith | 257/194 |
| 2007/0194354 A1 | 8/2007 | Wu | 257/288 |
| 2007/0235755 A1 | 10/2007 | Wu | 257/288 |
| 2007/0235775 A1 | 10/2007 | Wu | |
| 2007/0241368 A1 | 10/2007 | Mil'shtein | 257/192 |
| 2007/0249119 A1 | 10/2007 | Saito | 438/253 |
| 2008/0006898 A1 | 1/2008 | Yafune et al. | 257/471 |
| 2008/0067558 A1 | 3/2008 | Kawasaki | |
| 2008/0116492 A1 | 5/2008 | Wu | |
| 2008/0128752 A1 | 6/2008 | Wu | |
| 2008/0230786 A1 | 9/2008 | Heikman | |
| 2009/0032820 A1 | 2/2009 | Chen | 257/76 |
| 2009/0230429 A1 | 9/2009 | Miyamoto et al. | 257/192 |
| 2009/0230430 A1 | 9/2009 | Miyamoto et al. | 257/192 |
| 2009/0236635 A1 | 9/2009 | Wu et al. | 257/194 |
| 2010/0025730 A1 | 2/2010 | Heikman | |
| 2010/0155780 A1 | 6/2010 | Machida | |
| 2010/0201439 A1 | 8/2010 | Wu et al. | 327/581 |
| 2010/0314666 A1 | 12/2010 | Saito et al. | |
| 2011/0241020 A1 | 10/2011 | Saunier | 257/77 |
| 2011/0260217 A1 | 10/2011 | Okamoto | |
| 2012/0068722 A1 | 3/2012 | Khandelwal | |
| 2012/0068772 A1 | 3/2012 | Murad | |
| 2012/0104408 A1 | 5/2012 | Imada | 257/76 |
| 2012/0132959 A1 | 5/2012 | Parikh et al. | 257/194 |
| 2012/0175679 A1 | 7/2012 | Marino et al. | 257/194 |
| 2012/0218783 A1 | 8/2012 | Imada | 363/37 |
| 2012/0235156 A1 | 9/2012 | Kuraguchi | 257/76 |
| 2012/0261720 A1 | 10/2012 | Puglisi et al. | 257/194 |
| 2013/0062667 A1 | 3/2013 | Chini et al. | 257/195 |
| 2013/0069115 A1 | 3/2013 | Nakazawa | |
| 2013/0069117 A1 | 3/2013 | Yoshioka | |
| 2013/0083567 A1 | 4/2013 | Imada | 363/37 |
| 2013/0175544 A1 | 7/2013 | Oishi | |
| 2013/0193485 A1 | 8/2013 | Akiyama et al. | 257/194 |
| 2013/0292699 A1 | 11/2013 | Ueno | 257/76 |
| 2014/0001478 A1 | 1/2014 | Saunier et al. | 257/76 |
| 2014/0061659 A1 | 3/2014 | Teplik et al. | 257/76 |
| 2014/0175453 A1 | 6/2014 | Yamada | 257/76 |
| 2014/0239346 A1 | 8/2014 | Green | 257/76 |
| 2014/0264360 A1 | 9/2014 | Huang et al. | 257/76 |
| 2014/0353720 A1 | 12/2014 | Inoue | 257/192 |
| 2014/0361341 A1 | 12/2014 | Sriram et al. | 257/194 |
| 2014/0361343 A1 | 12/2014 | Sriram | 257/194 |

FOREIGN PATENT DOCUMENTS

| | | |
|---|---|---|
| CN | 1321340 A | 11/2001 |
| CN | 1242608 | 1/2003 |
| CN | 1428870 A | 7/2003 |
| CN | 1639875 A | 7/2005 |
| EP | 0069429 A | 1/1983 |
| EP | 0792028 A2 | 6/1997 |
| EP | 0792028 | 8/1997 |
| EP | 0792028 A | 8/1997 |
| EP | 1336989 | 8/2003 |
| EP | 1336989 A | 8/2003 |
| EP | 1336989 A2 | 8/2003 |
| EP | 2538446 A2 | 2/2012 |
| EP | 2538446 A3 | 1/2014 |
| JP | 62/237763 | 10/1987 |
| JP | 63-087773 | 4/1988 |
| JP | 305536 A | 2/1991 |
| JP | 30035536 | 2/1991 |
| JP | 05021793 A | 1/1993 |
| JP | 06-349859 | 12/1994 |
| JP | 06349859 | 12/1994 |
| JP | 6349859 | 12/1994 | 21/338 |
| JP | 6349859 A | 12/1994 |
| JP | 07038108 | 2/1995 |
| JP | 07050413 | 2/1995 |
| JP | 07176544 | 7/1995 |
| JP | 09232827 | 9/1997 |
| JP | H09232827 | 9/1997 |
| JP | 11008256 | 1/1999 |
| JP | H118256 | 1/1999 |
| JP | 1197455 | 4/1999 |
| JP | 11233525 | 8/1999 |
| JP | 11-274174 | 10/1999 |
| JP | 11274174 | 10/1999 |
| JP | 11274174 A | 10/1999 |
| JP | 2000-003919 | 1/2000 |
| JP | 2000003919 | 1/2000 |
| JP | 2000082671 | 3/2000 |
| JP | 2000-100831 | 4/2000 |
| JP | 2000100831 A | 4/2000 |
| JP | 2000-164926 | 6/2000 |
| JP | 2000174260 | 6/2000 |
| JP | 2000003919 A | 7/2000 |
| JP | 2002-270830 | 3/2001 |
| JP | 2001094091 | 4/2001 |
| JP | 2001160656 | 6/2001 |
| JP | 2001189324 | 7/2001 |
| JP | 2001-230263 | 8/2001 |
| JP | 2001-230407 | 8/2001 |
| JP | 2002-016245 | 1/2002 |
| JP | 2002016245 | 1/2002 |
| JP | 2002094054 | 3/2002 |
| JP | 2002100642 | 4/2002 |
| JP | 2002118122 | 4/2002 |
| JP | 2000270620 | 9/2002 |
| JP | 2002270830 A | 9/2002 |
| JP | 2002343814 | 11/2002 |
| JP | 2002094054 A | 3/2003 |
| JP | 2003100775 | 4/2003 |
| JP | 2003188189 | 7/2003 |
| JP | 2003203923 | 7/2003 |
| JP | 2003203923 A | 7/2003 |
| JP | 2003-297854 | 10/2003 |
| JP | 297854 | 10/2003 |
| JP | 2003297854 | 10/2003 |
| JP | 2003297854 A | 10/2003 |
| JP | 2005507174 | 3/2005 |
| JP | 2005093864 | 4/2005 |
| JP | 2005527102 A | 9/2005 |
| JP | 2005535113 | 11/2005 |
| JP | 2005343417 | 12/2005 |
| JP | 2007019560 | 1/2007 |
| JP | 2010278333 | 12/2010 |
| KR | 20000006218 | 1/2003 |
| TW | 334632 B | 6/1998 |
| TW | 552712 B | 9/2003 |
| TW | 579600 B | 3/2004 |
| TW | I2230978 B | 4/2005 |
| WO | WO 9908323 | 2/1999 |
| WO | WO 02093650 | 11/2002 |
| WO | WO 2003/032397 A2 | 4/2003 |
| WO | WO 03/038905 A | 5/2003 |
| WO | WO 2003/036729 | 5/2003 |
| WO | WO 03036729 | 5/2003 |
| WO | WO 03036729 A1 | 5/2003 |
| WO | WO 03038905 A2 | 5/2003 |
| WO | WO 2003036729 A1 | 5/2003 |
| WO | WO 2004068590 | 8/2004 |
| WO | WO 2004068590 A1 | 8/2004 |
| WO | WO 2006025971 | 7/2005 |
| WO | WO 05114743 | 12/2005 |
| WO | WO 06025971 | 3/2006 |
| WO | WO 2006025971 | 3/2006 |

OTHER PUBLICATIONS

CRC Press, *The Electrical Engineering Handbook*, Second Edition, Dorf, (1997) p. 994.

B. Gelmont, K. Kim, and M. Shur. "Monte Carlo Simulation of Electron Transport in Gallium Nitrate." *Journal of Applied Physics*, vol. 74, Issue 3, (Aug. 1, 1993) p. 1818-1821.

R. Gaska, J.W. Yang, A. Osinsky, Q. Chen, M.A. Khan, A.O. Orlov, G.L. Snider, M.S. Shur. "Electron Transport in AlGaN Heterostructures Grown on 6H—SiC Substrates." *Applied Physics Letters*, vol. 72, No. 6 (Feb. 9, 1998) p. 707-709.

(56) References Cited

OTHER PUBLICATIONS

Y. F. Wu et. al. "GaN-Based FETs for Microwave Power Amplification." *IEICE Transactions on Electronics*, E-82-C, (1999) p. 1895-1905.
Y.F. Wu, D. Kapolnek, J.P. Ibettson, P. Parikh, B.P. Keller, and U.K. Mishra. "Very-High Power Density AlGaN/GaN HEMTs." *IEEE Transactions on Electronic Devices*, vol. 48, Issue 3 (Mar. 2001) p. 586-590.
M. Micovic, A. Kurdoghlian, P. Janke, P. Hashimoto, D.W.S. Wong, J. S. Moon, L. McRay, and C. Nguyen. "AlGaN/GaN Heterojunction Field Effect Transistors Grown by Nitrogen Plasma Assisted Molecular Beam Epitaxy." *IEEE Transactions on Electronic Devices*, vol. 48, Issue 3, (Mar. 2001) p. 591-596.
Gaska et al., "High Temperature Performance of AlGaN/GaN HFET's on SiC Substrates." *IEEE Electron Letters* vol. 18, No. 10, (Oct. 1997) p. 492-494.
Ping et al., "DC and Microwave Performance of High Current AlGaN Heterostructure Field Effect Transistors Grown on P-Type SiC Substrates." *IEEE Electron Device Letters* vol. 19, No. 2, (Feb. 1998) p. 54-56.
L. Eastman, K. Chu, J. Smart, J. R. Shealy, "GaN Materials for High Power Microwave Amplifiers." *Materials Research Society* vol. 512 Wocsemmad, Monterey, CA (Feb. 1998) p. 3-7.
G. Sullivan et al., "High Power 10-GHz Operation of AlGaN HFET's in Insulating SiC." *IEEE Electron Device Letters* vol. 19, No. 6, (Jun. 1998) p. 198-200.
Wu et al., "High Al-Content AlGaN/GaN MODFETs for Ultrahigh Performance." *IEEE Electron Device Letters* vol. 19, No. 2, (Feb. 1998) p. 50-53.
Y. Ando, et al., "10-w/mm AlGaN—GaN Him With a Field Modulating Plate." *IEEE Electron Device Letters* vol. 24, No. 5, (May 2003) p. 289-292.
S. Karmalkar, U.K. Mishra, "Very High Voltage AlGaN/GaN High Electron Mobility Transistors Using a Field Plate Deposited on a Stepped Insulator." *Solid-State Electronics* vol. 45, (2001) pp. 1645-1662.
W. Saito et al., "600V AlGaN/GaN Power—HEMT: Design, Fabrication and Demonstration on High Voltage DC-DC Converter." *IEEE IEDM* vol. 23, No. 7, (2003) pp. 587-590.
Wu et al., "High-Gain Microwave GaN HEMTs With Source-Terminated Field-Plates", Cree Santa Barbara Technology Center.
Wu et al., "30-w/mm GaN HEMTs by Field Plate Optimization", IEEE, vol. 25, No. 3, Mar. 2004, p. 117-119.
Patent Abstracts of Japan, vol. 017, No. 295, Jun. 7, 1993.
Saito W et al., Design and Demonstration of High Breakdown Voltage GaN High Electron Mobility Transistor (HEMT) Using Field Plate Structure for Power Electronics Applications, Japanese Journal of Applied Physics, vol. 43, No. 4B, Apr. 2004, pp. 2239-2242, XP001227744.
Saito et al., Solid-State Electronics, Theoretical Limit Estimation of Lateral Wide Bandgap Semiconductor Power-Switching Device, Apr. 1, 2003, pp. 1555-1562.
Saito W. et al. "Design and Demonstration of High Breakdown Voltage GaN High Electron Mobility Transistor (HEMT) Using Field Plate Structure for Power Electronics Applications", Japanese Journal of Applied Physics, Japan Society of Applied Physics, Tokyo, JP vol. 43, , No. 4B, Apr. 2004 pp. 2239-2242, XP001227744, ISSN: 0021-4922.
Asano K et al: "Novel High Power AlGaAs/GaAs HFET With a Field-Modulating Plate Operated at 35 V Drain Voltage", Electron Devices Meeting, 1998. IDM '98 Technical Digest. International San Francisco, CA USA Dec. 6-9, 1998, Piscataway, NJ, USA IEEE US, Dec. 6, 1998, pp. 59-62 XP010321500.
Wakejima A et al, "High Power Density and Low Distortion Ingap Channel FETs With Field-Modulating Plate", IEICE Transactions on Electronics, Institute of Electronics Information and Comm. Eng. Tokyo, JP, vol. E85-C, No. 12, Dec. 2002, pp. 2041-2045, XP001161324.
Mok P K T et al, "A Novel High-Voltage High-Speed MESFET Using a Standard GaAs Digital IC Process" IEEE Transactions on Electron Devices, IEEE Inc. New York, US. vol. 41, No. 2, Feb. 1, 1994, pp. 246-250, XP000478051.
Karmalkar S. et al. "Very High Voltage AlGaN/GaN High Electron Mobility Transistors Using a Field Plate Deposited on a Stepped Insulator" Solid State Electronics, Elsevier Science Publishers, Barking, GB, vol. 45, No. 9, Sep. 2001, pp. 1645-1652, XP004317729.
Li J, et al "High Breakdown Voltage GaN HFET With Field Palte" Electronics Letters, IEE Stevenage, GB vol. 37, No. 3, Feb. 1, 2001, pp. 196-197, XP006016221.
Xing H. et al. "High Breakdown Voltage AlGaN—GaN HEMTs Achieved by Multiple Field Plates" IEEE Electron Device Letters, IEEE Inc. New York, US. vol. 25, No. 4, Apr. 2004, pp. 161-163, XP001190361.
Lu W et al. "P-Type Sige Transistors With Low Gate Leakage Using Sin Gate Dielectric", IEEE Electron Device Letters, IEEE, Inc., New York, US, vol. 20, No. 10, Oct. 1999 (Oct. 1999), pp. 514-516, XP000890470, ISSN: 0741-3106.
Zhang N-Q et al., "High Breakdown GaN HEMT With Overlapping Gate Structure", IEEE Electron Device Letters, IEEE, Inc. New York, US, vol. 9, Sep. 2000 (Sep. 2000), pp. 373-375, XP000954354, ISSN: 0741-3106.
Tilak, V. et al., "Effect of Passivation on AlGaN/GaN HEMT Device Performance", 2000 IEEE International Symposium on Compound Semiconductors. Proceedings of the IEEE $27^{th}$ International Symposium on Compound Semiconductors (Cat. No. $00^{TH}8498$), 2000 IEEE International Symposium on Compound Semiconductors Proceedings of TH, p. 357-363, XP002239700, 2000, Piscataway, NJ, USA, IEEE, USA ISBN: 0-7803-6258-6.
Applied Physics Letters, vol. 77, No. 9, Aug. 2000, AlGaN/GaN Metal-Oxide-Semiconductor Heterostructure Field-Effect Transistors on SiC Substrates, Kahn et al.pp. 1339-1340.
Japanese Journal of Applied Physics, vol. 43, No. 4B, 2004, pp. 2239-2242, XP-001227744, Design and Demonstration of High Breakdown Voltage GaN High Electron Mobility Transistor HEMT Using Field Plate Structure for Power Electronics Applications, Saito et al.
The Electrical Handbook, 2d Edition, Dorf, p. 994, (1997) CRC Press.
IEEE Electron Device Letters, vol. 18, No. 10, (Oct. 1997) p. 492.
Wu et al. "High A1 Content AlGaN/GaN HEMTs With Very High Performance", IEDM 1999 Digest pp. 925-927, Washington, D.C. Dec. 1999.
IEEE Transactions on Electron Devices, vol. 48, No. 3 Mar. 2001, pp. 581-585.
Heikman et al. "Growth of Fe Doped Semi-Insulating GaN by Metalorganic Chemical Vapor Deposition" Applied Physics Letters, vol. 81, No. 3, Jul. 2002 pp. 439-441.
Heikman, Growth and Characteristics of Fe-Doped GaN Journal of Crystal Growth 248 (2003) 513-517.
Saito et al. "High Breakdown Voltage AlGaN—GaN Power—HEMT Design and High Current Density Switching Behavior" IEEE Transactions on Electron Devices. vol. 50, No. 12, Dec. 2003, pp. 2528-2531.
Applied Physics Letters, vol. 77, No. 9, Aug. 2000, AIGaN/GaN Metal-Oxide-Semiconductor Heterostructure Field-Effect Transistors on SiC Substrates, Khan et al. pp. 1339-1341.
The First Office Action From China Application No. 200580015278.5, Filed Mar. 24, 2005, dated May 9, 2008.
PCT International Preliminary Report for Group of Related Applications, dated Aug. 25, 2008.
European Examination Report Application No. 05731252.2-2203 dated Jul. 30, 2008.
First Office Action from China, Application No. 200480032782.1, dated Jul. 18, 2008.
Office Action from related family, U.S. Appl. No. 11/807,701, dated Aug. 22, 2008.
Office Action from related family, U.S. Appl. No. 10/958,970, dated Sep. 10, 2008.
Japanese Patent Application Laid-open No. 22002-016245 Patent Abstracts of Japan.
Japanese Patent Application Laid-open No. 2001230407 Patent Abstracts of Japan.

(56) References Cited

OTHER PUBLICATIONS

Japanese Patent Application Laid-open No. 2002-343814 Patent Abstracts of Japan.
Japanese Patent Application Laid-open No. 63-087773 Patent Abstracts of Japan.
Japanese Patent Application Laid-open No. 2001-230263 Patent Abstracts of Japan.
Japanese Patent Application No. 2003-307916 (Laid-open No. 2005-079346) Patent Abstracts of Japan.
Japanese Patent Application No. 2003-081849 (Laid-open No. 2004-289038) Patent Abstracts of Japan.
Official Notice of Rejection dated Jun. 24, 2008, Japanese Patent Application No. 2006-526270 and comments.
Second Office Action from related China Application No. 200580015278.5, dated Dec. 19, 2008.
Saito, "Design and Demonstration of High Breakdown voltage GaN High Electron Mobility Transistor HEMT Using Field Plate Structure for Power electronics Applications" Japanese Journal of Applied Physics vol. 43, No. 4B, 2004, pp. 2230-2242.
Communication Pursuant to Article 94(3) EPC re: related European Application No. 07018026.0.
Official Notice of Final Decision of Rejection re Japan Patent App. No. 2006-526270, dated Jan. 23, 2009.
Related Chinese Office Action, Application No. 200580014866.7, dated Dec. 5, 2008.
Related Chinese Office Action, Application No. 200580014868.6.
First Office Action re related Chinese Application No. 200580015278.5, dated May 9, 2008.
First official communication regarding the related European Application No. 07018026.0, dated Dec. 17, 2008.
Office Action from European Patent Application No. 10183441.4, dated Dec. 2, 2010.
Office Action from European Patent Application No. 10183607.0 dated Dec. 6, 2010.
Notice Requesting Submission of Opinion in Korean Patent Application No. 10-2006-7004682 dated Feb. 17, 2011.
Third Office Action from related Chinese Application No. 200580014866.7, dated Oct. 30, 2009.
From related application: Chinese Patent Application No. 200580014868.6, Second Office Action dated Feb. 24, 2010.
Second Office Action re related Chinese Application No. 200480032782.1 dated Dec. 4, 2009.
Examiner's First Report on Patent Application re related Australian Application No. 2005246697 dated Mar. 19, 2010.
International Preliminary Examination Report re related PCT Application, PCT/US05/13725 dated May 25, 2007.
Office Action from European Patent Application No. 05756258.9 dated Jun. 10, 2010.
Office Action from European Patent Application No. 05735109.0 dated Aug. 27, 2010.
Notification of Rejection/Objection in Chinese Patent Application No. 200580014868.6 dated Aug. 11, 2010.
Notice of Reasons for Rejection for Japanese Patent Appl. No. 2007-513167, dated Jan. 9, 2013.
Summary of Decision of Rejection for Japanese Application No. 2007-513132, dated Mar. 13, 2012.
Decision of Rejection from Taiwanese Application No. 094111532, dated Apr. 11, 2012.
Supplemental Examination in European Patent Application No. 05731252.2 dated May 5, 2011.
Office Action for Taiwan Patent Application No. 09312733 dated Apr. 29, 2011.
Office Action for Korean Patent Application No. 10-2006-7026090 dated May 17, 2011.
Office Action for Taiwan Patent Application No. 094111532 dated Jul. 4, 2011.
Office Action for Korean Patent Application No. 10-2006-7026207 dated Jul. 26, 2011.
Summary of Notice of Reasons for Rejection for Japanese Patent Application No. JP 2007-513132 dated Sep. 13, 2011.
Summary of Notice of Reasons for Rejection for Japanese Patent Application No. JP 2007-513155 dated Sep. 13, 2011.
Summary of Notice of Reasons for Rejection for Japanese Patent Application No. 2007-513167 dated Dec. 6, 2011.
Decision of Rejection for counterpart Japanese Patent Application No. 2006-526270 dated Dec. 13, 2011.
"High Power Density and Low Distortion InGaP Channel FET's with Field-Modulating Plate", Wakejima, et al., IEICE Trans Electron. vol. E85-C, No. 12, Dec. 2002, pp. 2041-2045.
"Very high voltage AlGaN/GaN high electron mobility transistors using a field plate deposited on a stepped insulator", Karmalker, et al., Solid-State Electronics 45 (2001) pp. 1645-1652.
Extended European Search Report from Appl. No. 11183396-8-2203/2432021, dated Feb. 22, 2012.
Extended European Search Report from Appl. No. 11183404.0-2203, dated Feb. 28, 2012.
Examiner's Report from Canadian Appl. No. 2566361, dated Feb. 7, 2012.
Extended European Search Report from Application No. 11183655.7-2203, dated Mar. 1, 2012.
Examiner's Report for Canadian Patent Application No. 2,566,756, dated Feb. 16, 2012.
Examiner's Report for Canadian Patent Application No. 2,564,955, dated Feb. 24, 2012.
Summary of "Notice of Reasons for Rejection", Japanese Patent Application No. 2008-500703, dated Jan. 10, 2012.
Summary of "Notice of Reasons for Rejection", Japanese Patent Application No. 2007-238147, dated Jan. 24, 2012.
Pretrial Examination Communication from Examiner from Japanese Patent Appl. No. 2008-500703, Appeal No. 2013-05298, dated Jun. 3, 2013.
Office Action from U.S. Appl. No. 10/958,945, dated May 15, 2013.
Response to Office Action U.S. Appl. No. 10/958,945, dated Mar. 14, 2013.
Office Action from U.S. Appl. No. 10/958,945, dated Mar. 14, 2013.
Office Action from U.S. Appl. No. 12/497,468, dated Mar. 12, 2013.
Response to Office Action U.S. Appl. No. 12/497,468, dated Nov. 20, 2012.
Office Action from U.S. Appl. No. 12/497,468, dated Nov. 20, 2012.
Office Action from U.S. Appl. No. 13/245,579, dated Jan. 31, 2013.
Office Action from U.S. Appl. No. 13/072,449, dated Dec. 13, 2012.
Response to Office Action U.S. Appl. No. 13/072,449, filed Feb. 13, 2013.
Office Action from Taiwanese Patent Application No. 094114829, dated May 29, 2012.
Office Action from U.S. Appl. No. 10/786,755, dated Jun. 22, 2011.
Office Action from U.S. Appl. No. 11/807,701, dated May 18, 2010.
Office Action from U.S. Appl. No. 11/807,701, dated Jan. 26, 2010.
Office Action from U.S. Appl. No. 12/321,493, dated Aug. 18, 2010.
Office Action from U.S. Appl. No. 12/321,493, dated Jun. 23, 2011.
Office Action from U.S. Appl. No. 12/321,493, dated Jan. 26, 2011.
Office Action from U.S. Appl. No. 12/437,505, dated Jul. 21, 2010.
Office Action from U.S. Appl. No. 12/497,468, dated Aug. 18, 2011.
Office Action from U.S. Appl. No. 12/497,468, dated Mar. 7, 2011.
Office Action from U.S. Appl. No. 10/958,945, dated Sep. 23, 2011.
Office Action from U.S. Appl. No. 10/958,945, dated Apr. 1, 2011.
Office Action from U.S. Appl. No. 10/958,945, dated Sep. 1, 2010.
Office Action from U.S. Appl. No. 10/958,945, dated Jan. 28, 2010.
Office Action from U.S. Appl. No. 11/600,617, dated Dec. 22, 2009.
Office Action from U.S. Appl. No. 11/584,135, dated Jun. 15, 2011.
Office Action from U.S. Appl. No. 11/901,103, dated Feb. 11, 2011.
Office Action from U.S. Appl. No. 11/901,103, dated Jun. 8, 2010.
Interrogation from Japanese Patent Application No. 2007-513132, dated Sep. 25, 2012.
Office Action and Search Report from Taiwanese Patent Application No. 093127333, dated Jul. 5, 2012.
Office Action and Search Report from Taiwanese Patent Application No. 095103561, dated Jul. 24, 2012.
European Search Report from European Patent Application No. 12171403.4-2203/2515339, dated Nov. 12, 2012.
European Search Report from European Patent Application No. 12171401.8-2203/2515338, dated Nov. 13, 2012.

(56) References Cited

OTHER PUBLICATIONS

Decision of Rejection from Japanese Patent Application No. 2008-500703, dated Nov. 2, 2012.
Decision of Rejection from Japanese Patent Application No. 2007-513155, dated Nov. 13, 2012.
Examination Report for European Patent Application No. 05756258.9 dated Dec. 11, 2012.
Office Action from Taiwanese Patent Application No. 094111532, dated Nov. 23, 2012.
Office Action for counterpart Taiwan Patent Application No. 094111532 dated Jul. 4, 2011.
Ottice Action tor Taiwan Patent Application No. 093127333 dated Apr. 29, 2011.
Communication pursuant to Article 94(3) EPC, Application No. 05 731 252.2-2203 dated Nov. 5, 2011.
Summary of Notice of Reasons for Rejection for counterpart Japanese Patent Application No. JP 2007-513132 dated Sep. 13, 2011.
"A Novel High-Voltage High-Speed MESFET Using a Standard GaAs Digital IC Process", Philip Mok, et al, IEEE Transactions on Electron Devices, vol. 41, No. 2, Feb. 1994, pp. 246-250.
"Novel High Power AlGaAs/GaAs HFET with a Field-Modulating Plate Operated at 35V Drain Voltage", K. Asano, et al, 0-7803-4774-9/1998 IEEE, pp. 59-62.
"High Breakdown Voltage AlGaN—GaN Power—HEMT Design and High Current Density Switching Behavior", Wataru Saito, et al., IEEE Transactions on Electron Devices, vol. 50, No. 12, Dec. 2003, pp. 2528-2531.
Examination Report from European Patent Appl. No. 06 718 166.9, dated Aug. 13, 2013.
Office Action from U.S. Appl. No. 10/958,945, dated Aug. 16, 2013.
Office Action from U.S. Appl. No. 13/355,766, dated Aug. 9, 2013.
Office Action from Taiwanese Patent Appl. No. 101131917, dated Jul. 26, 2013.
Office Action from U.S. Appl. No. 13/245,579, dated Oct. 25, 2013.
Office Action from U.S. Appl. No. 10/958,945, dated Nov. 14, 2013.
Response to OA from U.S. Appl. No. 10/958,945, filed Jan. 10, 2014.
Second Office Action from Chinese Patent Appl. No. 201110265486.8, dated Mar. 13, 2014.
Notice of Reasons for Rejection from Japanese Patent Appl. No. 2007-513167, dated Feb. 4, 2014.
Interrogation from Japanese Patent Application No. 2007-513155, dated Jun. 25, 2013.
Decision of Rejection from Japanese Patent appl. No 2007-513167, dated Jul. 4, 2013.
Office Action from Taiwanese Patent Appl. No. 095103561, dated Jun. 27, 2013.
First Office Action from Chinese Patent Appl. No. 2011102654868, dated Jun. 19, 2013.
Notice of Reasons for Rejection from Japanese Patent Appl. No. 2007-513132, dated Jun. 25, 2013.
Office Action from Japanese Patent Appl. No. 2008-500703, dated Jun. 25, 2013.
A.J. Bergsma, "A Comprehensive Design Method for Dual Gate MOSFET Mixers". Ottawa Carleton Institute for Electrical Engineering, Dept. of Electronics, Carleton University, Ottawa, Canada, May 1995, © 1998 AJ Bergsma.
Vetury, et al., "Performance and RF Reliability of GaN—ON—SiC HEMTs Using Dual-Gate Architectures", Air Force Research Laboratory, Jul. 2006, Air Force Contract No. FA8650-05-C-5411, Wright-Patterson Air Force Base, OH 45433-7750.
Reason for Rejection from Japanese Patent Appl. No. 2012-157890, dated Dec. 24, 2013.
European Search Report from European Patent Appl. No. EP 2 538 446 A3, Published Jan. 15, 2014.
Reasons for Rejection from Japanese Patent Appl No. 2012-117726, dated Dec. 24, 2013.
Reasons for Rejection from Japanese Patent Appl. No. 2012-107672, dated Dec. 24, 2013.

Notice of Reasons for Rejection from Japanese Patent Appl. No. 2008-500703, dated Nov. 12, 2013.
Examination Report from Canadian Patent Appl. No. 2,566,756, dated Nov. 7, 2013.
European Search Report from European Patent Appl. No. 12180744.0-1552, dated Dec. 12, 2013.
Examination Report from Canadian Patent Appl. No. 2,564,955, dated Dec. 6, 2012.
Further Examination on European Patent Appl. No. 04 788 624.9, dated Aug. 5, 2014.
Decision of Patent Grant and Allowed Claims from Japanese Patent Appl. No. 2007-513167, dated Aug. 5, 2014.
International Search Report and Written Opinion from PCT/US2014/037728, dated Aug. 18, 2014.
Appeal Decision from Japanese Patent Appl. No. 2007-513155, dated Mar. 11, 2014.
Office Action from U.S. Appl. No. 13/355,766, dated Mar. 5, 2014.
Office Action from U.S. Appl. No. 13/245,579, dated Mar. 13, 2014.
Office Action from U.S. Appl. No. 10/958,945, dated Mar. 31, 2014.
Office Action from Japanese Patent Appl. No. 2013-050780, dated Jul. 1, 2014.
Third Office Action from Chinese Patent Appl. No. 200580014868.6, dated Jul. 2, 2014.
International Search Report and Written Opinion from Appl. No. PCT/US2014/041171, dated Sep. 22, 2014.
Office Action from U.S. Appl. No. 13/355,766, dated Jul. 30, 2014.
Third Office Action from Chinese Appl. No. 201110265486.8, dated Sep. 17, 2014.
Communication from European Appl. No. 07 018 026.0-1552, dated Oct. 14, 2014.
Decision from Taiwanese Patent Appl. No. 095103561 dated Mar. 31, 2014.
J. Li, et al., "High Breakdown Voltage GaN HFET with Field Plate", Electronic Letters, $1^{st}$ Feb. 2001; vol. 37, No. 3.
Office Action from Taiwanese Patent Appl. No. 101137523, dated Dec. 31, 2014.
Examiner Report from Canadian Patent Appl. No. 2,566,361, dated Feb. 4, 2015.
Decision of Rejection from Japanese Patent Application No. 2012-117726, dated Jan. 27, 2015.
Zhang, et al., "High Breakdown GaN HEMT with Overlapping Gate Structure", IEEE Electron Device Letters, vol. 21, No. 9, Sep. 2000.
Office Action from U.S. Appl. No. 13/913,490, dated Dec. 16, 2014.
Office Action from U.S. Appl. No. 13/929,487, dated Dec. 29, 2014.
Office Action from U.S. Appl. No. 10/958,945, dated Dec. 31, 2014.
Office Action from U.S. Appl. No. 14/025,478, dated Jan. 21, 2015.
Office Action from U.S. Appl. No. 13/355,766, dated Feb. 13, 2015.
Office Action from Japanese Patent Appl. No. 2012-107672, dated Nov. 11, 2014.
Decision of Rejection from Japanese Appl. No. 2012-157890, dated Oct. 21, 2014.
Office Action from Taiwanese Patent Appl. No. 101124701, dated Oct. 14, 2014.
Office Action from Japanese Patent Appl. No. 2013-050780, dated Dec. 9, 2014.
Office Action and Search Report from Taiwanese Appl. No. 102102725, dated Dec. 8, 2014.
Office Action from Taiwanese Patent Appl. No. 102102725, dated May 18, 2015.
Decision to Grant from European Patent Appl. No. 07018026.0, dated Aug. 6, 2015.
Office Action from U.S. Appl. No. 13/929,487, dated Jun. 3, 2015.
Office Action from U.S. Appl. No. 13/355,766, dated Jun. 22, 2015.
Notice of Allowance from Taiwanese Patent Appl. No. 095103561, dated Feb. 17, 2015.
Notice of Allowance from Taiwanese Patent Appl. No. 101124701, dated Mar. 2, 2015.
Fourth Office Action from Chinese Patent Appl. No. 200580014868.6 dated Feb. 15, 2015.
Intention to Grant from European Patent Appl. No. 07018026.0-1552, dated Mar. 25, 2015.
Fourth Office Action from Chinese Patent Appl. No. 201110265486.8, dated Apr. 15, 2015.

(56) References Cited

OTHER PUBLICATIONS

Examination from Canadian Patent Appl. No. 2,564,955, dated Apr. 7, 2015.
Office Action from Japanese Patent Appl. No. 2012-107672, dated Jun. 9, 2015.
Office Action from Japanese Patent Appl. No. 2012-157890, dated Apr. 22, 2015.
Notice of Allowance from Japanese Patent Appl. No. 2013-050780, dated Apr. 28, 2015.
Reasons for Rejection from Japanese Patent Appl. No. 2014-126655, dated May 26, 2015.
Office Action from U.S. Appl. No. 10/958,945, dated May 1, 2015.
Saito, et al., "Design and Demonstration of High Breakdown Voltage GaN High Electron Mobility Transistor (HEMT) Using Field Plate Structure for Power Electronics Applications", Japanese Journal of Applied Physics, Japan Society of Applied Physics, Tokyo, JP, vol. 43, No. 4B, Apr. 2004, pp. 2239-2242. XP001227744, ISSN: 0021-4922.
Saito, et al. "Theoretical Limit Estimation of Lateral Wide Band-gap Semiconductor Power-switching Device", Solid State Electronics, Elsevier Science Publishers, Barking, GP, vol. 48, No. 9, Apr. 23, 2004, pp. 1555-1562, XP004518805, ISSN: 0038-1101.
Notice of Allowance from Taiwanese Patent Appl. No 101137523, dated Sep. 25, 2015.
Examination Report from European Patent Appl. No. 10 183 441.4, dated Jul. 29, 2015.
Decision of Patent Grant from Japanese Patent Appl. No. 2012-157890, dated Aug. 18, 2015.
Fifth Office Action from Chinese Patent Appl. No 200580014868.6, dated Aug. 27, 2015.
Office Action from Taiwanese Patent Appl. No. 103120237, dated Sep. 15, 2015.
Office Action from U.S. Appl. No. 14/02,478, dated Aug. 4, 2015.
Response to OA from U.S. Appl. No. 14/025,478, filed Sep. 22, 2015.
Office Action from U.S. Appl. No. 10/958,945, dated Oct. 1, 2015.
Office Action from Japanese Patent Appl. No. 2014-126655, dated Jan. 26, 2016.
Correction of deficiencies from European Patent Appl. No. 14734340.4, dated Jan. 27, 2016.
Correction of deficiencies from European Patent Appl. No. 14727697.6, dated Jan. 20, 2016.
Examination from European Patent appl. No. 12 171 403.4-1552, dated Jan. 21, 2016.
Office Action from U.S. Appl. No. 13/913,490; dated Nov. 25, 2015.
Office Action from U.S. Appl. No. 14/025,470; dated Dec. 4, 2015.
Office Action from U.S. Appl. No. 10/958,945; dated Jan. 6, 2016.
Office Action from U.S. Appl. No. 13/929,487; dated Feb. 5, 2016.
Examination Report from Taiwanese Patent Appl. No. 103119694, dated Oct. 19, 2015.
Fifth Office Action and Search Report from Chinese Patent Appl. No. 201110265486.8, dated Dec. 3, 2015.
K. Asano, et al., "Novel High Power AIGaAs/GaAs HFET with a Field-Modulating Plate Operated at 35V Drain Voltage", ULSI Device Development Laboratories, NEC Corporation 9-1, Seiran 2-Chome, Otsu. Shiga 520-0833, Japan, 62-IEDM 98, pub. Date: Dec. 6, 1998.
Examination Report from European Patent Appl No. 12 171 401.8, dated Nov. 5, 2015.
Office Action from U.S. Appl. No. 10/958,945; dated Apr. 13, 2016.
Notice of Allowance for Application No. 2,564,955; dated Feb. 29, 2016.
Notice of Allowance for Application No. 2,566,361; dated Mar. 15, 2016.
Notice of Reasons for Rejection for Application No. 2015-145765; dated Apr. 26, 2016.
Notice of Allowance from Chinese Application No. 200580014868.6; dated Jul. 27, 2016.
Office Action for U.S. Appl. No. 10/958,945; dated Sep. 23, 2016.
Office Action from Japanese Application No. 2012-107672; dated Oct. 4, 2016.
Foreign Office Action for Taiwan Application No. 103120237; dated Oct. 20, 2016.
Foreign Office Action for Japanese Application No. 2015-145765; dated Nov. 18, 2016.
Office Action for U.S. Appl. No. 14/025,478; dated Dec. 1, 2016.
Foreign Office Action for European Appl. No. 14734340.4; dated Jan. 5, 2017.
Foreign Office Action for European Appl. No. 14733486.6; dated Jan. 5, 2017.
Office Action for U.S. Appl. No. 10/958,945; dated Jan. 10, 2017.
Office Action from U.S. Appl. No. 13/913,490; dated May 26, 2016.
Foreign office Action for Application No. 103120237; dated Jun. 8, 2016.
Office Action from U.S. Appl. No. 14/025,478; dated Jul. 5, 2016.
Notice of Allowance for Japanese Application No. 2014-126655; dated Jul. 5, 2016.
Notice of Allowance for Indian Application No. 6483/DELNP/2006; dated Aug. 4, 2016.
Office Action for U.S. Appl. No. 13/929,487; dated Feb. 23, 2017.
Japanese Office Action for Application No. 2003-297854; dated Apr. 18, 2017.
Japanese Petition Decision Application No. 2015-018473; dated Mar. 14, 2017.
Karmalkar S et al: "Very high voltage AIGaN/GaN high electronmobility transistors using a field plate deposited on a stepped insulator",Solid State Electronics, Elsevier Science Publishers, Barking, GB, val. 45, No. 9, Sep. 2001 (Sep. 2001), pp. 1645-1652, XP004317729, ISSN: 0038-1101.
Saito Wet al: "Design and Demonstration of High Breakdown Voltage GaN High Electron Mobility Transistor (HEMT) Using Field Plate Structure for Power Electronics Applications", Japanese Journal of Applied Physics, Japan Society of Applied Physics, Tokyo, JP, vol. 43, No. 4B, Apr. 2004 (Apr. 2004), pp. 2239-2242, XP001227744, ISSN: 0021-4922.
Foreign Office Action for European Application No. 5735109.0; dated Aug. 2, 2017.
Foreign Office Action tor European Application No. 11183404.0-1552; dated Nov. 30, 2017.
Foreign Office Action for Chinese Application No. 201480033000X; dated Dec. 7, 2017 .
Foreign Notice of Allowance for Taiwan Application No. 103120237; dated Dec. 28, 2017.
Foreign Office Action for European Application No. 06718166.9; dated Apr. 23, 2018.
Chini, A., et al., "Power and Linearity Characteristics of Field-Plated Recessed-Gate A1GaN—GaN HEMTs", IEEE Electron Device Letters, vol. 25, No. 5, May 2004, pp. 229-231.
Xu, Hongtao, et al., "A New Field-Plated GaN HEMT Structure with Improved Power and Noise Performance", International Journal of High Speed Electronics and Systems, vol. 14, No. 3, (2004), pp. 186-191.
Communication Pursuant to Article 94(3) EPC, issued in corresponding European Application No. 11 183 404.0, dated Dec. 4, 2020.
Office Action for Taiwan Application No. 105134046; dated Jun. 3, 2017.
Office Action for European Application No. 14727697.6; dated Jul. 17, 2017.
European Office Action for Application No. 04788642.9; dated May 28, 2018.

* cited by examiner

|  | $I_{d, max}$: before/after (mA/mm) | Pinch-off $V_t$: before/after (V) | $I_g$ at -25V: before/after (mA/mm) | Output power: before/after (dBm) |
|---|---|---|---|---|
| Device A: no gate-source FP | 1061 / Broke down | -3.62 / Broke down | 0.148 / Broke down | 30.36 / Broke down |
| Device B: with gate-source FP of 0.2 μm long | 1056 / 1043 | -3.55 / -3.41 | 0.114 / 0.370 | 30.50 / 30.40 |

WIDE BANDGAP TRANSISTORS WITH GATE-SOURCE FIELD PLATES

BACKGROUND OF THE INVENTION

Field of the Invention

The present invention relates to transistors and particularly to transistors utilizing field plates to improve performance.

Description of the Related Art

Improvements in the manufacturing of AlGaN/GaN semiconductor materials have helped advance the development of AlGaN/GaN transistors, such as high electron mobility transistors (HEMTs) for high frequency, high temperature and high power applications. AlGaN/GaN has large bandgaps, high peak and saturation electron velocity values [B. Gelmont, K. Kim and M. Shur, *Monte Carlo Simulation of Electron Transport in Gallium Nitride*, J. Appl. Phys. 74, (1993), pp. 1818-1821]. AlGaN/GaN HEMTs can also have 2DEG sheet densities in excess of $10^{13}$ cm$^{-2}$ and relatively high electron mobility (up to 2019 cm$^2$/Vs) [R. Gaska, et al., *Electron Transport in AlGaN-GaN Heterostructures Grown on 6H-SiC Substrates*, Appl. Phys. Lett. 72, (1998), pp. 707-709]. These characteristics allow AlGaN/GaN HEMTs to provide very high voltage and high power operation at RF, microwave and millimeter wave frequencies.

AlGaN/GaN HEMTs have been grown on sapphire substrates and have shown a power density of 4.6 W/mm and a total power of 7.6 W [Y. F. Wu et al., *GaN-Based FETs for Microwave Power Amplification*, IEICE Trans. Electron. E-82-C, (1999). pp. 1895-1905]; More recently, AlGaN/GaN HEMTs grown on SiC have shown a power density of 9.8 W/mm at 8 GHz [Y. F. Wu, et al., *Very-High Power Density AlGaN/GaN HEMTs*, IEEE Trans. Electron. Dev. 48, (2001), pp. 586-590] and a total output power of 22.9 W at 9 GHz [M. Micovic, et al., *AlGaN/GaN Heterojunction Field Effect Transistors Grown by Nitrogen Plasma Assisted Molecular Beam Epitaxy*, IEEE Trans. Electron. Dev. 48, (2001), pp. 591-596].

U.S. Pat. No. 5,192,987 to Khan et al. discloses GaN/AlGaN based HEMTs grown on a buffer and a substrate. Other AlGaN/GaN HEMTs and field effect transistors (FETs) have been described by Gaska et al., *High-Temperature Performance of AlGaN/GaN HFET's on SiC Substrates*, IEEE Electron Device Letters, 18, (1997), pp. 492-494; and Wu et al. *High Al-content AlGaN/GaN HEMTs With Very High Performance*, IEDM-1999 Digest, pp. 925-927, Washington DC, December 1999. Some of these devices have shown a gain-bandwidth product ($f_T$) as high as 100 gigahertz (Lu et al., *AlGaN/GaN HEMTs on SiC With Over 100 GHz ft and Low Microwave Noise*, IEEE Transactions on Electron Devices, Vol. 48, No. 3, March 2001, pp. 581-585) and high power densities up to 10 W/mm at X-band (Wu et al., *Bias-dependent Performance of High-Power AlGaN/GaN HEMTs*, IEDM-2001, Washington DC, Dec. 2-6, 2001) and Wu et al., *High Al-Content AlGaN/GaN MODFETs for Ultrahigh Performance*, IEEE Electron Device Letters 19, (1998), pp. 50-53).

Electron trapping and the resulting difference between DC and RF characteristics have been a limiting factor in the performance of these devices. Silicon nitride (SiN) passivation has been successfully employed to alleviate this trapping problem resulting in high performance devices with power densities over 10 W/mm at 10 Ghz. For example, U.S. Pat. No. 6,586,781, which is incorporated herein by reference in its entirety, discloses methods and structures for reducing the trapping effect in GaN-based transistors. However, due to the high electric fields existing in these structures, charge trapping is still an issue.

Field plates have been used to enhance the performance of GaN-based HEMTs at microwave frequencies [See S Kamalkar and U. K. Mishra, *Very High Voltage AlGaN/GaN High Electron Mobility Transistors Using a Field Plate Deposited on a Stepped Insulator*, Solid State Electronics 45, (2001), pp. 1645-1662]. These approaches, however, have involved a field plate connected to the gate of the transistor with the field plate on top of the drain side of the channel. This results in reducing the electric field on the gate-to-drain side of the transistor thereby increasing breakdown voltage and reducing the high-field trapping effect. Transistors, however, with gate-drain field plates only have shown relatively poor reliability performance, particularly at class C (or higher class) operation where the electric field on the source side of the gate becomes significant.

SUMMARY OF THE INVENTION

The present invention provides transistors that operate with reduced electric field on the source side of the gate. One embodiment of a transistor according to the present invention comprises an active region having a channel layer. Source and drain electrodes are in contact with the active region and a gate is between the source and drain electrodes and in contact with the active region. A spacer layer is on at least part of the surface of said active region between the gate and the drain electrode and between the gate and the source electrode. A field plate is on the spacer layer and extends on the spacer and over the active region toward the drain electrode. The field plate also extends on the spacer layer over the active region and toward the source electrode. At least one conductive path electrically connects the field plate to the source electrode or the gate.

One embodiment of a high electron mobility transistor (HEMT) according to the present invention comprises a buffer layer and barrier layer arranged successively on a substrate, with a two dimensional electron gas (2DEG) channel layer at the heterointerface between the buffer layer and said barrier layer. A source and a drain electrode are included both making contact with the 2DEG, and a gate is included on the barrier layer between the source and drain electrodes. A spacer layer is on at least part of the surface of the barrier layer between the gate and the drain electrode and between the gate and the source electrode. A field plate is on the spacer layer, extending on the spacer over the barrier layer toward the drain electrode and extending on the spacer layer over the barrier layer toward the source electrode. At least one conductive path electrically connects the field plate to the source electrode or the gate.

One embodiment of a metal semiconductor field effect transistor (MESFET) according to the present invention comprises a buffer layer on a substrate and a channel layer on the buffer layer, with the buffer layer sandwiched between the channel layer and substrate. A source electrode is in electrical contact with the channel layer and a drain electrode is also in electrical contact with the channel layer. A gate is included also in electrical contact with the channel layer between the source and drain electrodes. A spacer layer is on at least part of the surface of the channel layer between the gate and the drain electrode and between the gate and the source electrode. A field plate is on the spacer layer, extending on the spacer over the channel layer toward the drain electrode and extending on the spacer layer over the channel layer toward the source electrode. At least one conductive path electrically connects the field plate to the source electrode or the gate.

These and other further features and advantages of the invention would be apparent to those skilled in the art from the following detailed description, taken together with the accompanying drawings, in which:

DETAILED DESCRIPTION OF THE INVENTION

The gate-source field plate arrangements according to the present invention can be used with many different transistor structures, such as transistor structures made of wide bandgap materials. Transistors generally include an active region having a plurality of semiconductor layers, one of which is a channel layer. Metal source and drain electrodes formed in contact with the active region, and a gate formed on the active region between the source and drain electrodes for modulating electric fields within the active region. A first spacer layer is formed above the active region, over at least a portion of the surface of the active region between the gate and the drain. The first spacer layer can comprise a dielectric layer or a combination of multiple dielectric layers, and in certain embodiments other materials such as epitaxially grown layers. In one embodiment the first spacer layer covers the gate and the topmost surface of the active region between the gate and the drain electrode, and between the gate and the source electrode. In other embodiments as described below the spacer layer can cover less of the surface of the active region. In still other embodiments the spacer layer covers only the topmost surface of the active region between the gate and the source and drain, and not the gate.

A conductive first field plate is formed on the first spacer layer with the first spacer layer providing isolation between the field plate the active region below. The first field plate extends a distance $L_{fd}$ on the spacer layer from the edge of the gate toward the drain electrode, and extends a distance $L_{fs}$ on the spacer layer toward the source electrode. The first field plate can be electrically connected to either the source electrode or the gate. Additional spacer layer field and field plate pairs can also be included in different embodiments according to the invention.

This field plate arrangement can reduce the peak electric field in the device on both the source and drain side of the gate, resulting in increased breakdown voltage and reduced trapping. The reduction of the electric field can also yield other benefits such as reduced leakage currents and enhanced reliability. The field plates on both the source and drain sides of the gate are arranged such that the electric field on the source side of the gate is reduced, which enhances performance and robustness for applications that require more negatively biased gate conditions. This includes class-C and other higher classes (e.g. E, F) of operations. By having the field plate on the drain side as well, the transistor also experiences reduced peak electric field on the drain side.

One type of transistor that can utilize the gate-source plate arrangement according to the present invention is a high electron mobility transistor (HEMT), which typically includes a buffer layer and a barrier layer on the buffer layer. A two dimensional electron gas (2DEG) channel layer is induced at the heterointerface between the buffer layer and the barrier layer. A gate electrode is formed on the barrier layer between source and drain electrodes. The HEMT also includes the multiple spacer layer and field plate arrangement described above.

Another type of transistor that can utilize the gate-source field plate arrangement according to the present invention is a field effect transistor and particularly a metal semiconductor field effect transistor (MESFET), which typically includes a buffer layer and a channel layer on the buffer layer. A gate is formed on the channel layer between source and drain electrodes and the MESFET also includes the multiple spacer layer and field plate arrangement described above.

It will be understood that when an element or layer is referred to as being "on", "connected to", "coupled to" or "in contact with" another element or layer, it can be directly on, connected or coupled to, or in contact with the other element or layer or intervening elements or layers may be present. In contrast, when an element is referred to as being "directly on," "directly connected to", "directly coupled to" or "directly in contact with" another element or layer, there are no intervening elements or layers present. Likewise, when a first element or layer is referred to as being "in electrical contact with" or "electrically coupled to" a second element or layer, there is an electrical path that permits current flow between the first element or layer and the second element or layer. The electrical path may include capacitors, coupled inductors, and/or other elements that permit current flow even without direct contact between conductive elements.

Figure 1:
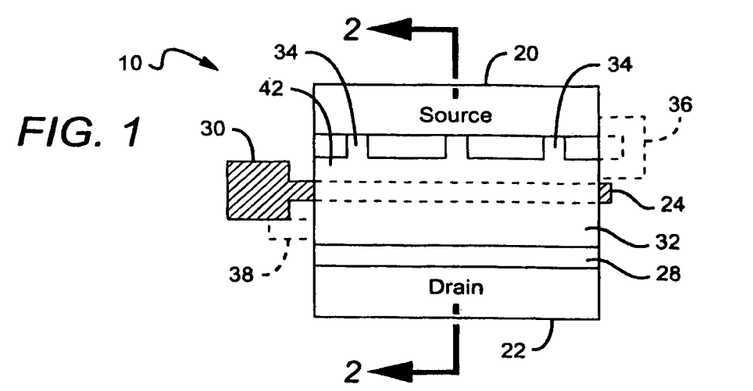
FIG. 1 is a plan view of one embodiment of a HEMT according to the present invention.
Figure 2:
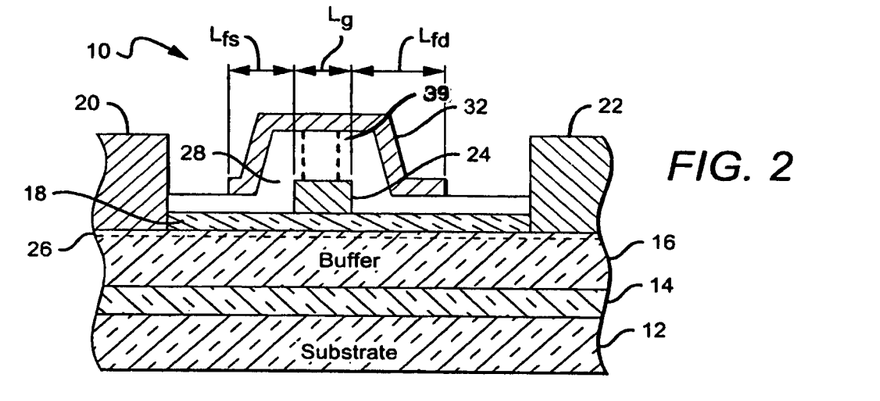
FIG. 2 is a sectional view of the HEMT shown in FIG. 1.

FIGS. 1 and 2 show one embodiment of a HEMT 10 according to the present invention that is preferably Group-III nitride based, although other material systems can also be used. Group III nitrides refer to those semiconductor compounds formed between nitrogen and the elements in the Group III of the periodic table, usually aluminum (Al), gallium (Ga), and indium (In). The term also refers to ternary and tertiary compounds such as AlGaN and AlInGaN.

The HEMT 10 comprises a substrate 12 which can be made from silicon carbide, sapphire, spinet, ZnO, silicon, gallium nitride, aluminum nitride, or any other material or combinations of materials capable of supporting growth of a Group-III nitride material. A nucleation layer 14 can be formed on the substrate 12 to reduce the lattice mismatch between the substrate 12 and the next layer in the HEMT 10. The nucleation layer 14 should be approximately 1000 angstroms (Å) thick, although other thicknesses can be used. The nucleation layer 14 can comprise many different materials, with a suitable material being $Al_zGa_{1-z}N$ ($0<=z<=1$), and can be formed on the substrate 12 using known semiconductor growth techniques such as Metal Organic Chemical Vapor Deposition (MOCVD), Hydride Vapor Phase Epitaxy (HVPE), or Molecular Beam Epitaxy (MBE).

Substrate 12 can be made of many different materials with a suitable substrate being a 4H polytype of silicon carbide, although other silicon carbide polytypes can also be used including 3C, 6H and 15R polytypes. Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as may be the case with some devices formed on sapphire). Also, the availability of silicon carbide substrates provides the capacity for device isolation and reduced parasitic capacitance that make commercial devices possible. SiC substrates are available from Cree, Inc., of Durham, N.C. and methods for producing them are set forth in the scientific literature as well as in a U.S. Pat. Nos. Re. 34,861; 4,946,547; and 5,200,022.

The formation of a nucleation layer 14 can depend on the material used for the substrate 12. For example, methods of forming a nucleation layer 14 on various substrates are taught in U.S. Pat. Nos. 5,290,393 and 5,686,738, each of which are incorporated by reference as if fully set forth herein. Methods of forming nucleation layers on silicon carbide substrates are disclosed in U.S. Pat. Nos. 5,393,993, 5,523,589, and 5,739,554 each of which is incorporated herein by reference as if fully set forth herein.

The HEMT 10 further comprises a high resistivity buffer layer 16 formed on the nucleation layer 14. The buffer layer 16 can comprise doped or undoped layers of Group III-nitride materials with a preferred buffer layer 16 made of a Group III-nitride material such as $Al_xGa_yIn_{1-x-y}N$ ($0<=x<=1$, $0<=y<=1$, $x+y<=1$). Other materials can also be used for the buffer layer 16 such as GaN that is approximately 2 µm thick, with part of the buffer layer doped with Fe.

A barrier layer 18 is formed on the buffer layer 16 with the buffer layer 16 being sandwiched between the barrier layer 18 and the nucleation layer 14. Like the buffer layer 16, the barrier layer 18 can comprise doped or undoped layers of Group III-nitride materials. The barrier layer can be made of one or multiple layers of $Al_xGa_{1-x}N$, where x ranges from 0-1, and x can be a function of depth such that the barrier layer 18 can be a graded layer. A 2DEG channel layer 26 is induced at the heterointerface between the buffer layer 16 and the barrier layer 18, with the buffer layer 16, 2DEG channel layer 26 and barrier layer 18 generally forming the HEMTs active region.

Exemplary HEMT structures are illustrated in U.S. Pat. Nos. 6,316,793, 6,586,781, 6,548,333 and U.S. Published patent application Ser. Nos. 2002/0167023 and 2003/00020092 each of which is incorporated by reference as though fully set forth herein. Other nitride based HEMT structures are illustrated in U.S. Pat. Nos. 5,192,987 and 5,296,395 each of which is incorporated herein by reference as if fully set forth herein. The buffer and barrier layers 16, 18 can be made using the same methods used to grow the nucleation layer 14. Electric isolation between the devices is accomplished through mesa etch or ion implementation outside the active HEMT.

Metal source and drain electrodes 20, 22 are formed in contact with the barrier layer 18, and a gate 24 is formed on the barrier layer 18 between the source and drain electrodes 20, 22. Electric current can flow between the source and drain electrodes 20, 22 through the 2DEG channel layer 26 between the buffer layer 16 and the barrier layer 18 when the gate 24 is biased at the appropriate level. The formation of source and drain electrodes 20, 22 is described in detail in the patents and publications referenced above.

The source and drain electrodes 20, 22 can be made of different materials including but not limited to alloys of titanium, aluminum, gold or nickel. The gate 24 can also be made of different materials including but not limited to gold, nickel, platinum, titanium, chromium, alloys of titanium and tungsten, or platinum silicide. The gate 24 can have many different lengths ($L_g$), with a suitable gate length ranging from 0.1 to 2.0 microns (µm), although other gate lengths can also be used. In one embodiment according to the present invention a preferred gate length ($L_g$) is approximately 0.5 microns.

A first non-conducting spacer layer 28 is formed over the gate 24 and at least part of the surface of the barrier layer 18 between the gate 24 and the source and drain electrodes 20, 22. As shown in FIG. 2, the spacer layer 28 covers all of the barrier layer 18 between the gate 24 and source and drain electrodes 22, 24. The spacer layer 28 can comprise a dielectric layer, or a combination of multiple dielectric layers. Different dielectric materials can be used such as a SiN, SiO2, Si, Ge, MgOx, MgNx, ZnO, SiNx, SiOx, alloys or layer sequences thereof. The spacer layer can be many different thicknesses, with a suitable range of thicknesses being approximately 0.03 to 0.5 microns. As best shown in FIG. 1, the gate 24 is contacted at a gate contact 30.

A first field plate 32 is formed on the spacer layer 28 over the gate 24, with the first field plate extending on the spacer layer 28 a distance $L_{fd}$ toward the drain electrode 22 and extending a distance $L_{fs}$ toward the source electrode 20. The spacer layer 28 is arranged to provide isolation between the first field plate 32 and the barrier layer 18 and gate 24, so the spacer layer 28 need only cover the gate 18 and barrier layer 18 below the first field plate 32. For ease of manufacturing, however, the spacer layer typically covers the entire barrier layer 18. $L_{fd}$ can be different distances with a suitable range of distances being from 0.1 to 5 microns. Similarly, $L_{fs}$ can be different distances with a suitable range of distances being 0.1 to 2 microns. In other embodiments, the field plates may not be continuous, but can have holes or interruptions as desired.

The field plate 32 can comprise many different conductive materials with a suitable material being a metal deposited using standard metallization methods. In one embodiment according to the present invention the field plate 30 comprises the same metal as the feature that it is electrically connected to as described below.

The first field plate 32 can be electrically connected to either the source electrode 20 or the gate 24. FIG. 1 shows one embodiment according to the present invention wherein the first field plate 32 is connected to the source electrode 20, with two alternative connection structures being shown. First conductive buses 34 can be formed on the spacer layer 26 to extend between the first field plate 32 and the source electrode 20. Different numbers of buses 34 can be used, although the more buses 34 that are used, the greater the unwanted capacitance that can be introduced by the buses.

The buses 34 should have a sufficient number so that current effectively spreads between the source electrode 20 and the first field plate 32, while covering as little of the HEMT's active region as possible. A suitable number of buses 34 can be three as shown in FIG. 1.

The first field plate 32 can also be electrically connected to the source electrode 20 through a first conductive path 36 that runs outside of the active region of the HEMT 10 and is connected to the source electrode 20. As shown in FIG. 1, the path 36 runs outside the active area of the HEMT at the edge opposite the gate contact 30. In alternative embodiments according to the present invention, the conductive path could run outside the active area of the HEMT 10 on the side of the gate contact 30, or the HEMT 10 could include two or more conductive paths running on one or both sides of the HEMT 10. In one embodiment, the conductive paths 34, 36 can be made of the same material as the source electrode 20 and in other embodiments they can be made of a different material and can be formed at a different step in the fabrication process after formation of the source electrode 20.

The first field plate 32 can also be electrically connected to the gate 24 by many different methods, with two suitable methods described herein. First, the field plate can be connected to the gate 24 by a second conductive path 38 that runs outside of the active region of the HEMT 10 between the first field plate 32 and gate 24. The conductive path 38 can connect to the gate contact 30 or a portion of the gate 24 outside of the HEMTs active region, such as the portion of the gate 24 opposite the gate contact 30. Alternatively, more than one conductive path can be used to connect the field plate 32 and gate 24.

An alternative connection structure comprises conductive paths in the form of conductive vias 39 (as shown in FIG. 2), which can be formed running from the first field plate 32 to the gate 24, through the first spacer layer 28. The vias 39 provide an electrical connection between the gate 24 and the first field plate 32 and the vias 39 can be formed by first forming holes in the first spacer layer 28, such as by etching, and then filling the holes with a conductive material either in a separate step or during formation of the first field plate 32. The vias 39 can be arranged periodically down the first field plate 32 to provide for effective current spreading from the gate 24 to the field plate 32.

Figure 3:
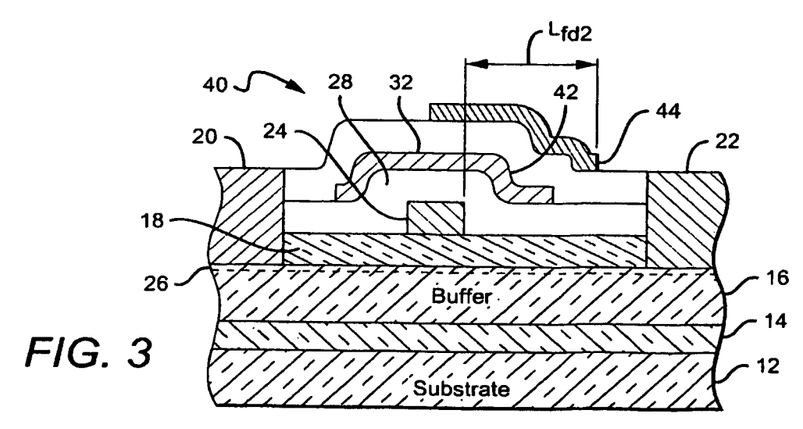
FIG. 3 is a sectional view of another embodiment of a HEMT according to the present invention.

FIG. 3 shows the HEMT 40 that is the same as the HEMT 10 of FIGS. 1 and 2, but also includes a second non-conducting spacer layer 42 that is formed over at least a portion of the first field plate 32, with a preferred second spacer layer 42 as shown covering the first field plate and the exposed surface of the first spacer layer 28. The second spacer layer 42 can be formed of the same material or layers of material as the first spacer layer 28 and can have a total thickness in the range of 0.05 to 2 microns.

A second field plate 44 can then be deposited on the second spacer layer 42. Different second field plates according to the present invention can provide different coverage, with the second field plate 44 as shown overlapping the gate 24. Other second field plates according to the present invention can have a space between the edge of the gate 24 and the starting edge of the second field plate. Another portion of the second field plate 44 extends from the edge of gate 24 toward the drain contact 22 a distance $L_{fd2}$, which can be in the range of 0.2 to 5 microns. In those embodiments where the second spacer layer 42 covers less than all of the first field plate 32 and spacer layer 28, the second spacer layer 42 must cover enough of the first field plate 32 to provide electrical isolation between the first and second field plates 32, 44.

The second field plate 44 can be connected to the source electrode 20 or the gate 24 and many different connecting structures can be used. Second conductive buses can be formed on the second spacer layer 42 to extend between the second field plate 44 and the source electrode 20. Different numbers of buses can be used so that current effectively spreads from the source electrode 20 into the second field plate 44, while not covering too much of the active region such that unwanted capacitance is introduced. The first field plate 32 can also be electrically connected to the source electrode 20 through a third conductive path that runs outside of the active region of the HEMTs 40 and is connected to the source electrode 20.

After deposition of the second field plate 44 and its connection to the source electrode 20, the active structure can be covered by a dielectric passivation layer (not shown), such as silicon nitride. Methods of forming the dielectric passivation layer are described in detail in the patents and publications referenced above. The HEMT 10 in FIGS. 1 and 2 and the HEMTs and MESFETs described below can also be covered by a dielectric passivation layer after formation of the spacer layer(s) and field plates(s).

Figure 4:
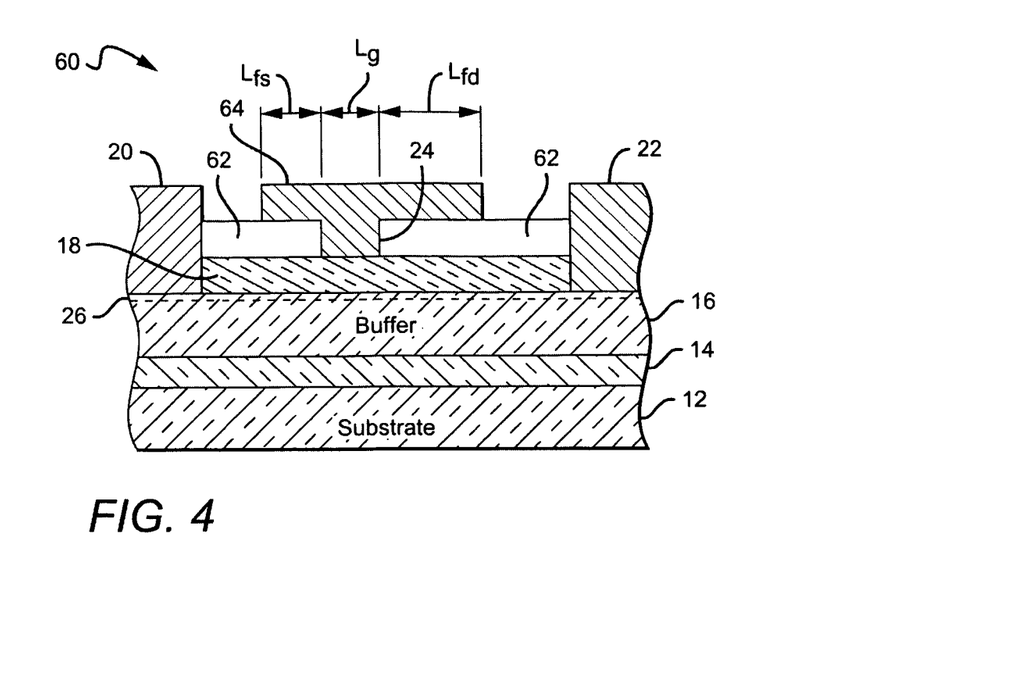
FIG. 4 is a sectional view of another embodiment of a HEMT according to the present invention.

FIG. 4 shows another embodiment of a HEMT 60 according to the present invention having many features that are similar to those in HEMT 10, and for those similar features the same reference numbers are used. HEMT 60 comprises a substrate 12, nucleation layer 14, buffer layer 16, barrier layer 18, source electrode 20, drain electrode 22, gate 24 and 2DEG 26 channel layer. Like above, the gate 24 has a width $L_g$ ranging from 0.1 to 5 microns.

The HEMT 60, however, comprises a spacer layer 62 that does not cover the gate 24, but instead covers the barrier layer 18 between the gate 24 and the source and drain contacts 20, 22. In other embodiments, the spacer layer can cover less than the entire surface of the barrier layer 18, as described above. The coverage should be enough to provide electric isolation between the first field plate 64 and the barrier layer 18. The first field plate 64 is formed integral to the gate 24 and extends on the spacer layer 62 a distance $L_{fd}$ in the range of 0.2 to 5 microns toward the drain contact 22, and a distance $L_{fs}$ in the range of 0.1 to 2 microns toward the source contact 20. For the HEMT 60 the first field plate is electrically connected to the gate 24 by its integral formation with the gate 24. The field plate 62 can be fully integral with the gate or can have breaks of holes in its integral connection on either the source or drain side of the contact, or both, as long as enough conductive paths are available to effectively spread current between the gate 24 and field plate 64.

In HEMT 60 the first spacer layer 62 can be formed before device metallization and in those instances the spacer layer can comprise an epitaxial material such as a Group III nitride material having different Group III elements such as alloys of Al, Ga, or In, with a suitable spacer layer material being $Al_xGa_{1-x}N$ (0≤x≤1). After epitaxial growth of the barrier layer 18, the first spacer layer 62 can be grown using the same epitaxial growth method. The first spacer layer 62 is then etched to provide an opening for the gate 24, source electrode 20 and drain electrode 22. During metallization the gate 24 is formed in electrical contact with the barrier layer 18 and the first field plate 64 is formed integral to the gate and extending on the spacer layer 62. The source and drain electrodes 20, 22 can be formed during this same metallization step.

In other embodiments the gate 24 can be first metalized on the active region and the spacer layer can be formed of a dielectric material on the active region between the gate 24 and source and drain contacts 20, 22. The field plate 64 can then be formed integral to the gate 24. By having the field plate 64 extend toward both the source electrode 20 and the gate electrode 22, the HEMT 60 experiences the same operating benefits as the HEMT 10 in FIGS. 1 and 2.

Figure 5:
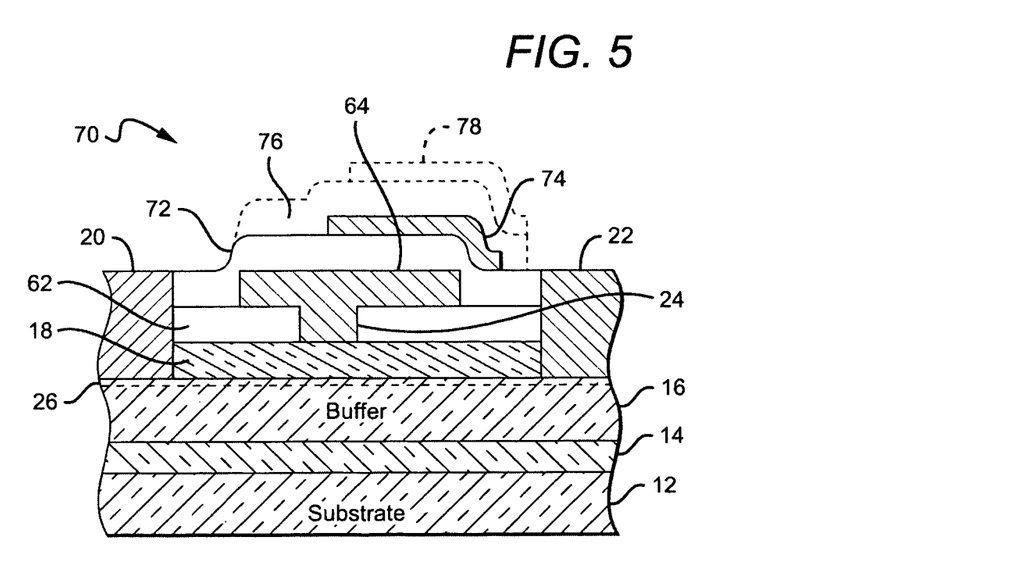
FIG. 5 is a sectional view of another embodiment of a HEMT according to the present invention having multiple field plates.

FIG. 5 shows another embodiment of a HEMT 70 that is similar to the HEMT 60 shown in FIG. 4 and has a substrate 12, nucleation layer 14, buffer layer 16, barrier layer 18, source electrode 20, drain electrode 22, gate 24, 2DEG channel layer 26, first spacer layer 62 and first field plate 64. The HEMT 70, however, also has a second dielectric spacer layer 72 and a second field plate 74, with the second spacer layer covering enough of the first field plate 64 to provide electric isolation between the first and second field plates 64, 74. As shown, the spacer layer covers the first field plate 64 and the exposed surfaces of the first spacer layer 62. The second field plate 74 can be electrically connected to the source contact 20 or the gate using different methods, including the conductive paths described above that run outside the HEMT's active region.

The HEMTs 40 and 70 (as well as the HEMTs and MESFETs described below) can also comprise additional spacer layer and field plate pairs over the second field plate 72 and second spacer layer 74. FIG. 5 shows an additional pair on the HEMT 70 comprising a third spacer layer 76 (in phantom) and a third field plate 78 (in phantom), with the spacer layer 76 covering enough of the second field plate 74 to provide electric isolation between the second and third field plates 74, 76. The third field plate 78 (and any subsequent field plates) can also be electrically coupled to the source electrode or gate, by the methods described above.

In a preferred embodiment, the top field plate is connected to the source electrode while the intermediate field plates below can be connected to the source electrode or the gate. For example, a transistor according to the present invention can have three field plates, with the top one connected to the source electrode and the ones below connected to either the source electrode or the gate.

This multiple field plate arrangement can further reduce the peak electric field in the device, resulting in increased breakdown voltage and reduced trapping. This can improve gain and stability that can be negatively impacted by gate connected field plates. When arranged according to the present invention, the shielding effect of a source-connected field plate can reduce $C_{gd}$, which enhances input-output isolation.

Figure 6:
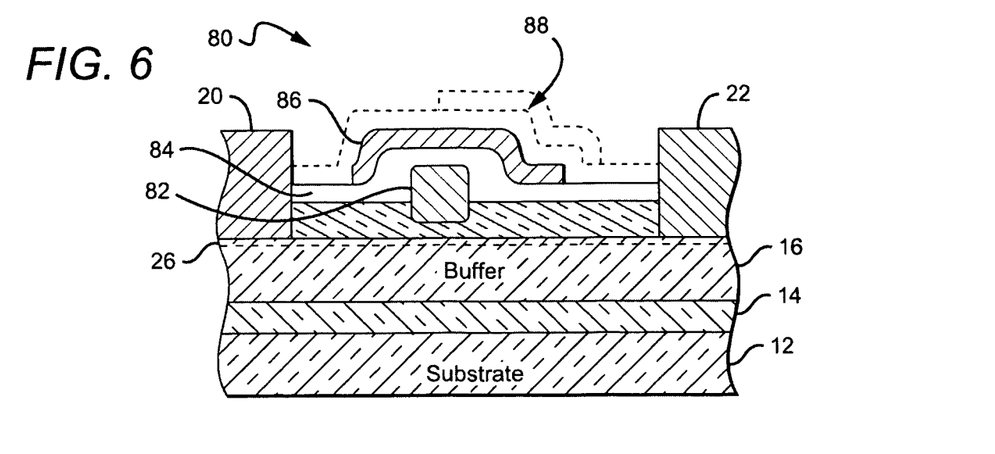
FIG. 6 is a sectional view of another embodiment of a HEMT according to the present invention having multiple field plates.
Figure 7:
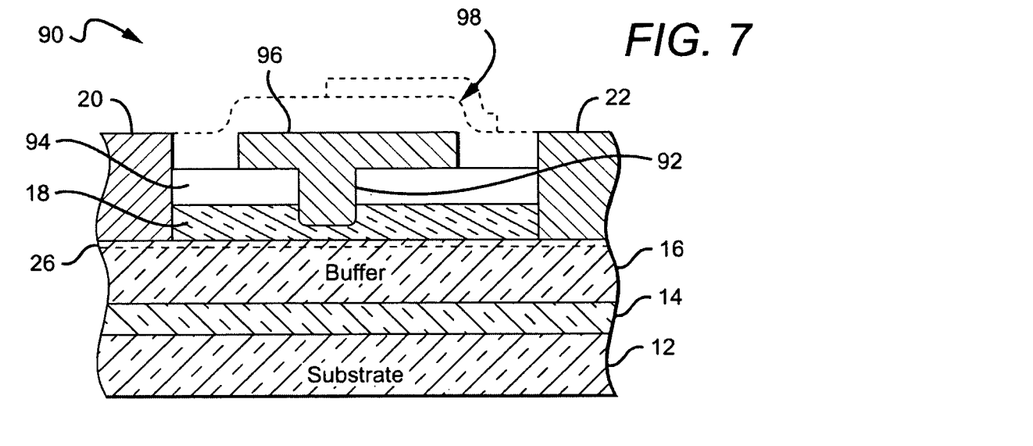
FIG. 7 is a sectional view of another embodiment of a HEMT according to the present invention having multiple field plates.

FIG. 6 shows another embodiment of a HEMT 80 according to the present invention that is similar to the HEMT 10 in FIGS. 1 and 2, and FIG. 7 shows another embodiment of a HEMT 90 according to the present invention that is similar to the HEMT 70 in FIG. 5. HEMTs 80 and 90 each have a substrate 12, nucleation layer 14, buffer layer 16, barrier layer 18, source electrode 20, drain electrode 22 and 2DEG channel layer 26. The HEMT 80 has a gate 82, a first dielectric spacer layer 84 and first field plate 86, but unlike the gate 24 in FIGS. 1 and 2, the gate 80 is recessed in the barrier layer 18. The first spacer layer 84 covers the gate 82 and barrier layer sufficiently to provide electric isolation between the gate 82 and the field plate 86, and the field plate extends on the spacer layer 84 on one side of the gate toward the drain electrode 20 and on the other side toward the source electrode 22, both in the ranges of distances described above. Additional spacer layer and field plate pairs can be included and electrically connected as described above, with the HEMT 80 having a second pair 88 (shown in phantom).

The HEMT 90 has a gate 92, spacer layer 94 and integral field plate 96, with the gate 92 recessed in the barrier layer 18. The spacer layer 94 can be made of the same materials as the spacer layer 84 shown in FIG. 5 and described above, and could cover enough of the barrier layer 18 to provide electrical isolation between the field plate 96 and the barrier layer. In other embodiments the bottom surface of the gate can be partially recessed or different portions of the gate can be recessed to different depths in the barrier layer 18. Additional spacer layer and field plate pairs can be included and electrically connected as described above, with the HEMT 90 having a second pair 98 (shown in phantom).

Figure 8:
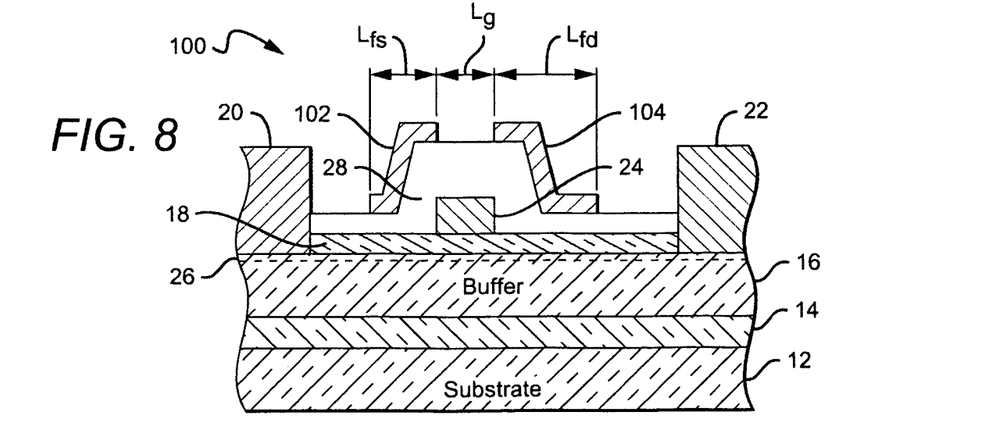
FIG. 8 is a sectional view of another embodiment of a HEMT according to the present invention.

FIG. 8 shows another embodiment of a HEMT 100 according to the present invention that is similar to the HEMT 10 shown in FIGS. 1 and 2 and has a substrate 12, nucleation layer 14, buffer layer 16, barrier layer 18, source electrode 20, drain electrode 22, gate 24, 2DEG 26 and first spacer layer 28. However, instead of having a single first field plate, it has a first field plate that is separated into a source field plate 102 and a drain field plate 104. The source field plate 102 overlaps the source side of the gate 24 and extends a distance $L_{fs}$ on the spacer layer 28 toward the source electrode 20, with $L_{fs}$ being in the range of distances described above. The drain field plate 104 overlaps the gate 24 and extends a distance $L_{fd}$ on the spacer layer 28 toward the drain contact 22, with $L_{fd}$ being in the range of distances described above. The source and drain field plates 102, 104 can each be connected to the source contact 20 or the gate 24 (using the methods described above), or one can be connected to the source contact 20 and the other connected to the gate 24.

In different embodiments, the source and drain field plates 102, 104 do not need to overlap the gate 24, and one or both can have a gap between the edge of the gate and the edge of the field plate. Overlapping of the gate can introduce additional capacitance that can negatively impact performance. For source and drain field plates to effectively reduce the electric field, a gap between the edge of the gate and the field plates must be relatively small, which can present some difficulties during fabrication. By having the field plates 102, 104 overlap the gate 24, the HEMT can be fabricated without having to meet the tolerances of this small gap. In determining whether to use an overlapping field plate or non-overlapping field plate, the ease of manufacturing is balanced with the reduced capacitance.

Figure 9:
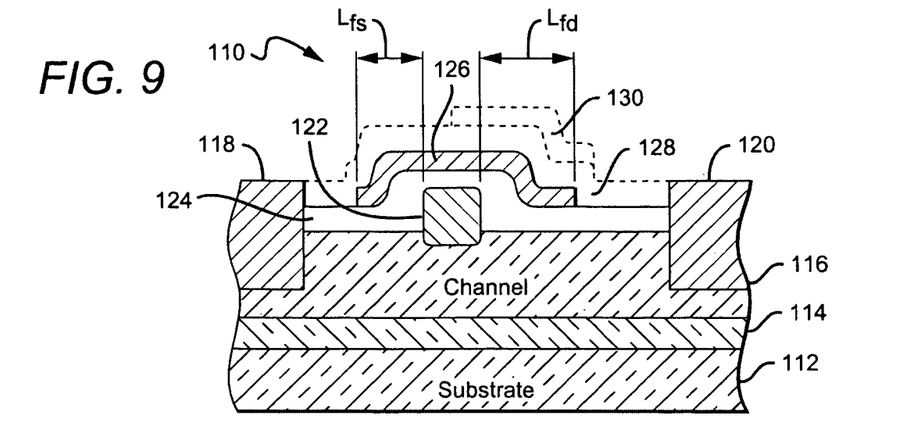
FIG. 9 is a sectional view of one embodiment of a MESFET according to the present invention.

The structures of the present invention can also be used in other types of transistors made of different material systems. FIG. 9 shows one embodiment of a MESFET 110 according to the present invention that is silicon carbide based. MESFET 110 comprises a silicon carbide substrate 112 on which a silicon carbide buffer 114 and a silicon carbide channel layer 116 are formed with the buffer 114 sandwiched between the channel layer 116 and substrate 112. The buffer 114 and channel layer 116 generally form the MESFET's active region. Source and drain electrodes 118, 120 are formed in contact with the channel layer 116 and a gate 122 is formed on the channel layer 116 between the source and drain electrodes 118, 120. In the preferred embodiment, the gate 122 is recessed in the channel layer 116, although it can also be on the channel layer 116 without recess as long as adequate electrical contact is made between the two. The gate 122 can also be partially recessed, with only part of its bottom surface recessed in the channel layer 116.

A non-conducting (dielectric) spacer layer 124 is formed over the gate 122 and the surface of the channel layer 116 between the gate 122 and the source and drain electrodes 118, 120. Similar to the spacer layer 28 described above and shown in FIGS. 1 and 2, the spacer layer 124 can comprise a layer of non-conducting material such as a dielectric, or a number of different layers of non-conducting materials such as different dielectrics.

A first field plate 126 is formed on the spacer layer 124 between and over the gate 122 and extends a distance $L_{fs}$ on the spacer layer 124 toward the source electrode 118, and a distance $L_{fd}$ toward the drain electrode 120, both in the range of distances described above. The field plate 126 can also be connected to either the source electrode 118 or the gate 122 using the same connecting structures as described above. The first field plate can also comprise more than one field plate, such as the two piece drain field plate and source field plate arrangement described above.

A second non-conducting spacer layer 128 (in phantom) can be formed over the first field plate 126 and first spacer layer 124 and is similar to second spacer layer 40 described above and shown in FIG. 3. Similarly, a second field plate 130 (in phantom) is provided on the second spacer layer 128, and is similar to the second field plate 42 described above and shown in FIG. 3, and is similarly connected.

Figure 10:
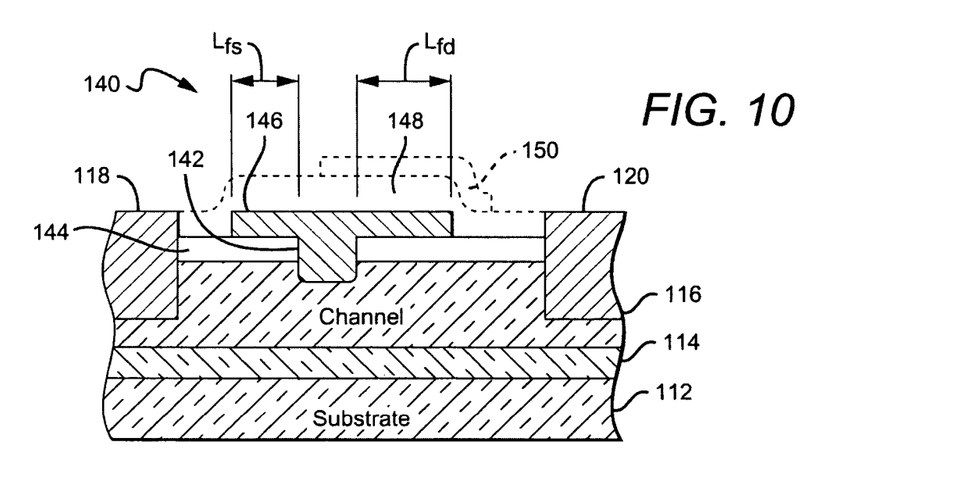
FIG. 10 is a sectional view of another embodiment of a MESFET according to the present invention.

FIG. 10 shows another embodiment of a silicon carbide MESFET 140 according to the present invention that has similar features of the MESFET 110 in FIG. 9, including a substrate 112, buffer 114, channel layer 116, source electrode 118, drain electrode 120. A recessed gate 142 is formed on the channel layer 116 between the source and drain electrodes 118, 120, although it can also be on the channel layer 116. MESFET 140 also comprises a spacer layer 144 that does not overlap the gate 142, but covers at least part of the surface of the channel layer 116 between the gate 142 and the source and drain electrodes 118, 120. Field plate 146 is formed integral with the gate 142 and extends a distance $L_{fs}$ on the spacer layer 144 toward the source electrode 118, and a distance $L_{fd}$ toward the drain electrode 120, both in the range of distances described above. The spacer layer 144 can be a dielectric material and in those instances where the spacer layer 144 is formed before device metallization, the spacer layer can comprise an epitaxial material as described above.

Figure 11:
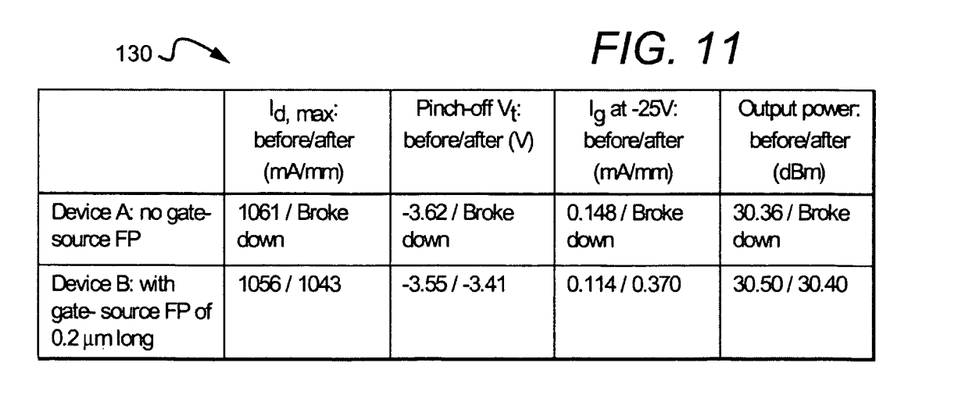
FIG. 11 is a table comparing the operating characteristics of a HEMT according to the present invention compared to a HEMT with no field gate-source field plate.

FIG. 11 shows a table 130 comparing the operating characteristics of GaN based HEMT (Device A) with no gate-source field plate compared to the operating characteristics of a GaN based HEMT (Device B) with a gate-source field plate having a length of 0.2 microns. The measurements of Device A and B were taken in reference to power degradation at 200C class-C operation for 10 hours with Vg=−7V at 4 gigahertz (GHz) driven to 1 decibel (dB) compression. The measurements show breakdown in Device A, while Device B does not experience breakdown under the same conditions.

It is understood that the field plate arrangement can be applied to other transistors beyond HEMTs and MESFETs, with one example being a Metal Oxide Semiconductor Heterostructure Field Effect Transistor (MOSHFET). In MOSHFETS, the spacer layer can be formed between the gate and the MOSHFETs active region. The spacer layer can be partially removed from under the gate so that the gate is on a then spacer (insulator) layer while the field plate is on a thicker spacer (insulator) layer. The gate would still be "in contact" with the active region through the insulator layer, with the MOSHFET arrangement designed to reduce gate leakage.

The embodiments above provide wide bandgap transistors with improved power at microwave and millimeter wave frequencies. The transistors exhibit simultaneous high gain, high power, and more stable operation due to higher input-output isolation. The structure could be extended to larger dimensions for high voltage applications at lower frequencies.

Although the present invention has been described in considerable detail with reference to certain preferred configurations thereof, other versions are possible. The field plate arrangement can be used in many different devices. The field plates can also have many different shapes and can be connected to the source contact in many different ways. For example, the field plate can extend from over the HEMT's active area such that the connection is continuous between the field plate and source contact, instead of through buses or conductive paths. This arrangement can, however, introduce prohibitive capacitance into the structure. Accordingly, the spirit and scope of the invention should not be limited to the preferred versions of the invention described above.

We claim:

1. A transistor, comprising:
an active region comprising a channel layer, said channel layer comprising a two dimensional electron gas (2DEG) region;
a source electrode and a drain electrode in electrical contact with said active region;
a metal gate between said source electrode and said drain electrode and on said active region;
a metal first field plate that is integral with said gate;
a first spacer layer on said active region between said gate and said drain electrode and between said gate and said source electrode,
wherein said first field plate extends on said first spacer layer over a vertical projection of said active region from a first vertical edge of said gate toward said drain electrode and from a second vertical edge of said gate toward said source electrode, and wherein said second vertical edge is opposite from said first vertical edge;
a second spacer layer;
a second field plate on said second spacer layer, said second spacer layer separating said second field plate from said gate and from said first field plate; and
a conductive path electrically connecting said second field plate to said source electrode, wherein in a plan view said conductive path comprises a first portion that extends from the second field plate to beyond the vertical projection of the active region, and a second portion that extends from beyond the vertical projection of the active region to the source electrode, and wherein the second field plate and the source electrode are on the active region.

2. The transistor of claim 1, wherein said first field plate extends on said first spacer layer a first lateral distance $L_{fd}$ from said first vertical edge of said gate toward said drain electrode, wherein said first field plate extends on said first spacer layer a second lateral distance $L_{fs}$ from said second vertical edge of said gate toward said source electrode, and wherein said first lateral distance $L_{fd}$ is greater than said second lateral distance $L_{fs}$.

3. The transistor of claim 1, wherein said second spacer layer covers said gate and said second field plate overlaps said gate and extends on said second spacer layer past said first vertical edge of said gate toward said drain electrode and extends on said second spacer layer past said second vertical edge of said gate toward said source electrode.

4. The transistor of claim 1, wherein said active region is on a substrate.

5. The transistor of claim 1, wherein said active region comprises Group-III nitride based semiconductor materials.

6. The transistor of claim 1, wherein said first or second spacer layer comprises a dielectric material, or multiple layers of dielectric material.

7. The transistor of claim 1, wherein said first or second field plate is configured to provide a reduction in peak operating electric field on a drain side of said gate and a source side of said gate.

8. The transistor of claim 7, wherein said reduction in peak operating electric field increases a breakdown voltage of said transistor.

9. The transistor of claim 7, wherein said reduction in peak operating electric field reduces trapping.

10. The transistor of claim 7, wherein said reduction in peak operating electric field reduces leakage currents in said transistor.

11. The transistor of claim 1, comprising a high electron mobility transistor (HEMT).

12. The transistor of claim 1, further comprising one or more additional spacer layer and field plate pairs, each spacer layer in said pairs providing physical separation between sequential field plates, each field plate in said pairs electrically connected to said source electrode or said gate.

13. The transistor of claim 1, wherein said first field plate comprises separate source and drain field plates, said source field plate extending on said first spacer layer toward said source electrode and said drain field plate extending on said first spacer layer toward said drain electrode, said source and drain field plates electrically connected to said source electrode or said gate.

14. The transistor of claim 1, wherein said first field plate comprises separate source and drain field plates, said source field plate extending on said first spacer layer toward said source electrode and said drain field plate extending on said first spacer layer toward said drain electrode, said source field plate electrically connected to one of said source electrode and said gate, said drain field plate connected to the other of said source electrode and said gate.

15. The transistor of claim 1, wherein an entirety of a conduction channel between the source electrode and the drain electrode is free of vertical overlap with the first portion and the second portion of said conductive path.

16. The transistor of claim 1, wherein the first portion extends away from the second field plate in a first direction, and the second portion extends toward the source electrode in a second direction that is different from the first direction.

17. The transistor of claim 16, wherein the second direction is opposite to the first direction.

18. The transistor of claim 17, further comprising a connecting portion that extends from the first portion to the second portion in a third direction that is different from the first and second directions.

19. A transistor, comprising:
a buffer layer and barrier layer successively on a substrate;
an active region comprising a two dimensional electron gas (2DEG) channel layer at a heterointerface between said buffer layer and said barrier layer;
a source electrode and a drain electrode both making electrical contact with said 2DEG channel layer;
a metal gate on said barrier layer between said source electrode and said drain electrode, the gate comprising a metal first field plate that is integral with the gate;
a first spacer layer on said barrier layer between said gate and said drain electrode and between said gate and said source electrode,
wherein the first field plate is on said first spacer layer, said first field plate comprising a first portion extending on said first spacer layer over said barrier layer a first distance from a first vertical edge of said gate toward said drain electrode and a second portion extending on said first spacer layer over said barrier layer a second distance from a second vertical edge of said gate toward said source electrode, wherein said second vertical edge is opposite from said first vertical edge, and wherein said first spacer layer separates said first field plate from said barrier layer;
a second spacer layer and a second field plate on said second spacer layer, with said second field plate over less than all of said first field plate and with said second spacer layer separating said second field plate from said first field plate; and
a conductive path electrically connecting said second field plate to said source electrode, wherein in a plan view at least a portion of said conductive path extending from the second field plate to beyond a vertical projection of said active region, and from beyond the vertical projection of said active region to the source electrode, and wherein the second field plate and the source electrode are on said active region.

20. The transistor of claim 19, wherein said first distance is greater than said second distance.

21. The transistor of claim 19, wherein said first distance is in a range of 0.2 to 5 microns and said second distance is in a range of 0.1 to 2 microns.

22. A transistor, comprising:
an active region comprising a channel layer, said channel layer comprising a two dimensional electron gas (2DEG) region;
a source electrode and a drain electrode each in electrical contact with said active region;
a first spacer layer over said active region between said drain electrode and said source electrode;
a gate that is between said source electrode and said drain electrode, said gate comprising a field plate portion and a gate portion,
wherein said gate portion extends between said field plate portion of said gate and said active region to contact said active region,
wherein said field plate portion of said gate extends toward said drain electrode and toward said source electrode on said first spacer layer, wherein a first outermost edge of said field plate portion is closer to said drain electrode than a first outermost edge of said gate portion, and wherein a second outermost edge of said field plate portion is closer to said source electrode than a second outermost edge of said gate portion;
a second spacer layer over said field plate portion of said gate;
a second field plate on said second spacer layer such that said second field plate and said field plate portion of said gate are not in direct contact; and
at least one conductive path on said second spacer layer electrically connecting said second field plate to said source electrode, wherein in a plan view said at least one conductive path comprising a first portion that extends from the second field plate to beyond a vertical projection of the active region, and a second portion that extends from beyond the vertical projection of the active region to the source electrode, and wherein the second field plate and the source electrode are on the active region.

23. A transistor, comprising:

an active region comprising a channel layer, said channel layer comprising a two dimensional electron gas (2DEG) region;

a source electrode and a drain electrode each in electrical contact with said active region with said active region spanning an entire distance between said source and drain electrodes;

a gate between said source and drain electrodes and on said active region;

a first spacer layer on said active region between said drain electrode and said source electrode;

a first field plate extending on said first spacer layer over a vertical projection of said active region toward said drain electrode such that said first field plate is spaced from said source and drain electrodes and is not in direct contact with said active region;

a gap between said source electrode and said first field plate such that said first field plate is spaced from said source electrode by a horizontal distance, said first field plate located between said source and drain electrodes;

a second spacer layer over said first spacer layer;

a second field plate on said second spacer layer covering less than all of said first field plate, wherein said second spacer layer separates said second field plate from said first field plate such that said second field plate and said first field plate are not in direct contact;

a plurality of conductive buses electrically connecting said first field plate to said source electrode, said plurality of conductive buses covering a portion of said first spacer layer between a portion of said gate nearest said source electrode and said source electrode; and a second conductive path electrically connecting said second field plate to said source electrode, wherein in a plan view said second conductive path comprising a first portion that extends from the second field plate to beyond the vertical projection of the active region, and a second portion that extends from beyond the vertical projection of the active region to the source electrode, wherein said second field plate covers less than all of said first spacer layer between a portion of said gate nearest said source electrode and said source electrode, and wherein said second field plate and said source electrode are on the active region.

24. A transistor device, comprising:

a plurality of semiconductor layers, including a two dimensional electron gas (2DEG) layer;

a source in electrical contact with said plurality of semiconductor layers;

a drain in electrical contact with said plurality of semiconductor layers;

a first spacer layer on at least a portion of said plurality of semiconductor layers between said source and said drain;

a gate comprising a metal between said drain and said source, said gate in contact with at least a top one of said plurality of semiconductor layers, said gate comprising an integral first field plate comprising said metal that extends on said first spacer layer from a first vertical edge of said gate toward said drain and from a second vertical edge of said gate toward said source, wherein said second vertical edge is opposite said first vertical edge;

a second spacer layer on said gate and said first spacer layer; and a second field plate on said second spacer layer and over a portion of said first field plate, said second field plate electrically connected to said source, wherein said second field plate is not integral to said first field plate, wherein said second field plate is electrically coupled to said source by a conductive path, wherein said second field plate and said conductive path cover less than all of said first spacer layer between said second vertical edge of said gate and said source, wherein in a plan view said conductive path comprises a first portion that extends from the second field plate to beyond a vertical projection of an active region comprising the 2DEG layer, and a second portion that extends from beyond the vertical projection of the active region to the source, and wherein the second field plate and the source are on the active region.

25. The transistor device of claim 24, further comprising a third spacer layer on said second field plate, and a third field plate on said third spacer layer and separated from said second field plate by said third spacer layer.

26. The transistor device of claim 24, wherein said plurality of semiconductor layers comprises:

a buffer layer on said active region; and a barrier layer on said buffer layer opposite said active region.

27. The transistor device of claim 24, further comprising additional spacer layer field plate pairs, wherein said additional spacer layers and field plate pairs are such that said additional spacer layers separate said additional field plates.

28. The transistor device of claim 24, wherein said transistor device is a high electron mobility transistor (HEMT).

29. The transistor device of claim 24, wherein said conductive path comprises at least one conductive bus that is on said second spacer layer such that said second spacer layer provides electrical isolation between said at least one conductive bus and said first field plate.

* * * * *

UNITED STATES PATENT AND TRADEMARK OFFICE
CERTIFICATE OF CORRECTION

PATENT NO. : 11,791,385 B2
APPLICATION NO. : 11/078265
DATED : October 17, 2023
INVENTOR(S) : Wu et al.

Page 1 of 1

It is certified that error appears in the above-identified patent and that said Letters Patent is hereby corrected as shown below:

On the Title Page

(56) References Cited, FOREIGN PATENT DOCUMENTS, Page 3, Column 1, Line 69: Please correct "JP 30035536 2/1991" to read --JP 03035536 2/1991--

(56) References Cited, FOREIGN PATENT DOCUMENTS, Page 3, Column 2, Line 43: Please correct "JP 2005343417 12/2005" to read --JP 2005340417 12/2005--

(56) References Cited, OTHER PUBLICATIONS, Page 5, Column 1, Line 29, Related Chinese Office Action Cite: Please insert --Received Dec. 5, 2008-- after "200580014868.6"

(56) References Cited, OTHER PUBLICATIONS, Page 6, Column 1, Line 15: Please correct "Ottice Action tor" to read --Office Action for--

(56) References Cited, OTHER PUBLICATIONS, Page 7, Column 1, Line 32: Please correct "14/02,478" to read --14/025,478--

(56) References Cited, OTHER PUBLICATIONS, Page 7, Column 1, Line 45: Please correct "14/025,470" to read --14/025,478--

In the Specification

Column 5, Lines 43-44: Please correct "0<= x<-1" to read --0<=x<=1--

Signed and Sealed this
Twenty-sixth Day of December, 2023

Katherine Kelly Vidal
*Director of the United States Patent and Trademark Office*